(12) United States Patent  
Millward et al.

(10) Patent No.: US 8,518,275 B2  
(45) Date of Patent: Aug. 27, 2013

(54) GRAPHOEPITAXIAL SELF-ASSEMBLY OF ARRAYS OF DOWNWARD FACING HALF-CYLINDERS

(75) Inventors: Dan B. Millward, Boise, ID (US); Donald Westmoreland, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/396,039

(22) Filed: Feb. 14, 2012

(65) Prior Publication Data

US 2012/0138570 A1    Jun. 7, 2012

Related U.S. Application Data

(62) Division of application No. 12/114,173, filed on May 2, 2008, now Pat. No. 8,114,301.

(51) Int. Cl.
*B44C 1/22* (2006.01)
*H01L 21/302* (2006.01)
*B82Y 40/00* (2011.01)

(52) U.S. Cl.
USPC ........ 216/2; 216/17; 216/39; 216/41; 216/49; 216/55; 216/67; 216/83; 216/99; 977/888; 977/895; 977/900; 438/700; 438/947

(58) Field of Classification Search
None
See application file for complete search history.

(56) References Cited

U.S. PATENT DOCUMENTS

| | | |
|---|---|---|
| 4,623,674 A | 11/1986 | Bailey et al. |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson |
| 5,482,656 A | 1/1996 | Hiraoka et al. |
| 5,512,131 A | 4/1996 | Kumar et al. |
| 5,538,655 A | 7/1996 | Fauteux |
| 5,622,668 A | 4/1997 | Thomas |
| 5,834,583 A | 11/1998 | Hancock et al. |
| 5,849,810 A | 12/1998 | Muller |
| 5,879,582 A | 3/1999 | Havelka et al. |
| 5,891,356 A | 4/1999 | Inoue et al. |
| 5,904,824 A | 5/1999 | Oh |
| 5,925,259 A | 7/1999 | Biebuyck et al. |
| 5,948,470 A | 9/1999 | Harrison et al. |
| 6,111,323 A | 8/2000 | Carter et al. |
| 6,143,647 A | 11/2000 | Pan et al. |
| 6,270,946 B1 | 8/2001 | Miller |
| 6,310,138 B1 | 10/2001 | Yonezawa et al. |

(Continued)

FOREIGN PATENT DOCUMENTS

| | | |
|---|---|---|
| CN | 1562730 | 1/2005 |
| EP | 0784543 B1 | 4/2000 |

(Continued)

OTHER PUBLICATIONS

Berry, B. C., et al., "Effects of Zone Annealing on Thin Films of Block Copolymers", National Institute of Standard and Technology, Polymers Division, Maryland, USA, 2007, 2 pages.

(Continued)

*Primary Examiner* — Anita Alanko
(74) *Attorney, Agent, or Firm* — TraskBritt

(57) ABSTRACT

Methods for fabricating sub-lithographic, nanoscale microstructures in line arrays utilizing self-assembling block copolymers, and films and devices formed from these methods are provided.

19 Claims, 16 Drawing Sheets

(56) References Cited

U.S. PATENT DOCUMENTS

| | | |
|---|---|---|
| 6,312,971 B1 | 11/2001 | Amundson et al. |
| 6,368,871 B1 | 4/2002 | Christel et al. |
| 6,403,382 B1 | 6/2002 | Zhu et al. |
| 6,423,465 B1 | 7/2002 | Hawker et al. |
| 6,503,841 B1 | 1/2003 | Criscuolo |
| 6,506,660 B2 | 1/2003 | Holmes et al. |
| 6,548,830 B1 | 4/2003 | Noguchi et al. |
| 6,565,763 B1 | 5/2003 | Asakawa |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,884,842 B2 | 4/2005 | Soane et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,913,697 B2 | 7/2005 | Lopez et al. |
| 6,924,341 B2 | 8/2005 | Mays |
| 6,926,953 B2 | 8/2005 | Nealey et al. |
| 6,946,332 B2 | 9/2005 | Loo et al. |
| 6,949,456 B2 | 9/2005 | Kumar |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,998,152 B2 | 2/2006 | Uhlenbrock |
| 7,030,495 B2 | 4/2006 | Colburn et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,077,992 B2 | 7/2006 | Sreenivasan et al. |
| 7,090,784 B2 | 8/2006 | Asakawa et al. |
| 7,115,525 B2 | 10/2006 | Abatchev et al. |
| 7,115,995 B2 | 10/2006 | Wong |
| 7,118,784 B1 | 10/2006 | Xie |
| 7,132,370 B2 | 11/2006 | Paraschiv et al. |
| 7,135,144 B2 | 11/2006 | Christel et al. |
| 7,135,388 B2 | 11/2006 | Ryu et al. |
| 7,135,523 B2 | 11/2006 | Ho et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,252,791 B2 | 8/2007 | Wasserscheid et al. |
| 7,259,101 B2 | 8/2007 | Zurcher et al. |
| 7,282,240 B1 | 10/2007 | Jackman et al. |
| 7,291,284 B2 | 11/2007 | Mirkin et al. |
| 7,326,514 B2 | 2/2008 | Dai et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,407,887 B2 | 8/2008 | Guo |
| 7,408,186 B2 | 8/2008 | Merkulov et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,592,247 B2 | 9/2009 | Yang et al. |
| 7,605,081 B2 | 10/2009 | Yang et al. |
| 7,632,544 B2 | 12/2009 | Ho et al. |
| 7,767,099 B2 | 8/2010 | Li et al. |
| 8,083,953 B2 | 12/2011 | Millward et al. |
| 8,101,261 B2 | 1/2012 | Millward et al. |
| 8,114,300 B2 | 2/2012 | Millward |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0158432 A1 | 10/2002 | Wain |
| 2003/0077452 A1 | 4/2003 | Guire et al. |
| 2003/0091752 A1 | 5/2003 | Nealey et al. |
| 2003/0100822 A1 | 5/2003 | Lew et al. |
| 2003/0143375 A1 | 7/2003 | Noguchi et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0235930 A1 | 12/2003 | Bao et al. |
| 2004/0028875 A1 | 2/2004 | Van Rijn et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0159633 A1 | 8/2004 | Whitesides et al. |
| 2004/0175628 A1 | 9/2004 | Nealey et al. |
| 2004/0192013 A1 | 9/2004 | Ryu et al. |
| 2004/0222415 A1 | 11/2004 | Chou |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol |
| 2005/0100830 A1 | 5/2005 | Xu et al. |
| 2005/0124135 A1 | 6/2005 | Ayazi et al. |
| 2005/0147841 A1 | 7/2005 | Tavkhelidze et al. |
| 2005/0167651 A1 | 8/2005 | Merkulov et al. |
| 2005/0208752 A1 | 9/2005 | Colburn et al. |
| 2005/0238889 A1 | 10/2005 | Iwamoto |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0038182 A1 | 2/2006 | Rogers et al. |
| 2006/0046079 A1 | 3/2006 | Lee |
| 2006/0046480 A1 | 3/2006 | Guo |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0154466 A1 | 7/2006 | Lee et al. |
| 2006/0163646 A1 | 7/2006 | Black |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells |
| 2007/0045562 A1 | 3/2007 | Parekh |
| 2007/0071881 A1 | 3/2007 | Chua et al. |

| | | | |
|---|---|---|---|
| 2007/0072403 A1 | 3/2007 | Sakata | |
| 2007/0122932 A1 | 5/2007 | Kodas et al. | |
| 2007/0138131 A1 | 6/2007 | Burdinski | |
| 2007/0161237 A1 | 7/2007 | Lieber et al. | |
| 2007/0175859 A1 | 8/2007 | Black et al. | |
| 2007/0181870 A1 | 8/2007 | Libertino et al. | |
| 2007/0200477 A1 | 8/2007 | Tuominen et al. | |
| 2007/0208159 A1 | 9/2007 | McCloskey et al. | |
| 2007/0218202 A1 | 9/2007 | Ajayan et al. | |
| 2007/0222995 A1 | 9/2007 | Lu | |
| 2007/0224819 A1 | 9/2007 | Sandhu | |
| 2007/0224823 A1 | 9/2007 | Sandhu | |
| 2007/0227383 A1 | 10/2007 | Decre et al. | |
| 2007/0249117 A1 | 10/2007 | Kang et al. | |
| 2007/0272951 A1 | 11/2007 | Lieber et al. | |
| 2007/0281220 A1 | 12/2007 | Sandhu et al. | |
| 2007/0289943 A1 | 12/2007 | Lu et al. | |
| 2007/0293041 A1 | 12/2007 | Yang et al. | |
| 2008/0032238 A1 | 2/2008 | Lu et al. | |
| 2008/0083991 A1 | 4/2008 | Yang et al. | |
| 2008/0085601 A1 | 4/2008 | Park et al. | |
| 2008/0093743 A1 | 4/2008 | Yang et al. | |
| 2008/0103256 A1 | 5/2008 | Kim et al. | |
| 2008/0164558 A1 | 7/2008 | Yang et al. | |
| 2008/0176767 A1 | 7/2008 | Millward | |
| 2008/0193658 A1 | 8/2008 | Millward | |
| 2008/0217292 A1 | 9/2008 | Millward et al. | |
| 2008/0233323 A1 | 9/2008 | Cheng et al. | |
| 2008/0257187 A1 | 10/2008 | Millward | |
| 2008/0260941 A1 | 10/2008 | Jin | |
| 2008/0274413 A1 | 11/2008 | Millward | |
| 2008/0286659 A1 | 11/2008 | Millward | |
| 2008/0311347 A1 | 12/2008 | Millward et al. | |
| 2008/0315270 A1 | 12/2008 | Marsh et al. | |
| 2008/0318005 A1 | 12/2008 | Millward | |
| 2009/0062470 A1 | 3/2009 | Millward et al. | |
| 2009/0155579 A1 | 6/2009 | Greco et al. | |
| 2009/0200646 A1 | 8/2009 | Millward et al. | |
| 2009/0206489 A1 | 8/2009 | Li et al. | |
| 2009/0236309 A1 | 9/2009 | Millward et al. | |
| 2009/0240001 A1 | 9/2009 | Regner | |
| 2009/0263628 A1 | 10/2009 | Millward | |
| 2009/0274887 A1 | 11/2009 | Millward et al. | |
| 2010/0092873 A1 | 4/2010 | Sills et al. | |
| 2010/0102415 A1 | 4/2010 | Millward et al. | |
| 2010/0124826 A1 | 5/2010 | Millward et al. | |
| 2010/0137496 A1 | 6/2010 | Millward et al. | |
| 2010/0163180 A1 | 7/2010 | Millward | |
| 2010/0204402 A1 | 8/2010 | Millward et al. | |
| 2010/0279062 A1 | 11/2010 | Millward | |
| 2010/0316849 A1 | 12/2010 | Millward et al. | |
| 2010/0323096 A1 | 12/2010 | Sills et al. | |

FOREIGN PATENT DOCUMENTS

| | | | |
|---|---|---|---|
| EP | 1416303 A2 | 5/2004 | |
| EP | 1593164 B1 | 6/2010 | |
| JP | 11080414 | 3/1999 | |
| JP | 2003155365 A | 5/2003 | |
| JP | 2004335962 A | 11/2004 | |
| JP | 2006036923 | 2/2005 | |
| JP | 2006055982 | 3/2006 | |
| JP | 2005008882 | 7/2006 | |
| JP | 2008036491 | 2/2008 | |
| KR | 100771886 B1 | 11/2007 | |
| TW | 200400990 A | 1/2004 | |
| TW | 200419017 | 10/2004 | |
| TW | 200511364 | 3/2005 | |
| TW | I253456 | 4/2006 | |
| TW | 256110 | 6/2006 | |
| WO | 9007575 | 7/1990 | |
| WO | 9706013 | 2/1997 | |
| WO | 9839645 A1 | 9/1998 | |
| WO | 9947570 | 9/1999 | |
| WO | 0031183 A1 | 6/2000 | |
| WO | 02081372 A2 | 10/2002 | |
| WO | 2005122285 A2 | 12/2005 | |
| WO | 2006076016 | 7/2006 | |
| WO | 2006078952 | 7/2006 | |
| WO | 2007001294 | 1/2007 | |
| WO | 2007/013889 A2 | 2/2007 | |
| WO | 2007019439 A3 | 2/2007 | |
| WO | 2007024241 | 3/2007 | |
| WO | 2007024323 A2 | 3/2007 | |
| WO | 2007055041 | 5/2007 | |
| WO | 2008091741 A2 | 7/2008 | |
| WO | 2008096335 A2 | 8/2008 | |
| WO | 2008097736 A2 | 8/2008 | |
| WO | 2008118635 A2 | 10/2008 | |
| WO | 2008124219 A2 | 10/2008 | |
| WO | 2008130847 A1 | 10/2008 | |
| WO | 2008145268 A2 | 12/2008 | |
| WO | 2008156977 A2 | 12/2008 | |
| WO | 2009099924 A2 | 8/2009 | |
| WO | 2009102551 A2 | 8/2009 | |
| WO | 2009117238 A2 | 9/2009 | |
| WO | 2009117243 A1 | 9/2009 | |
| WO | 2009134635 A2 | 11/2009 | |

OTHER PUBLICATIONS

Helmbold, A., et al., "Optical Absorption of Amorphous Hydrogenated Carbon Thin Films," Thin Solid Films 283 (1996) pp. 196-203.

Lutolf, M., et al., "Cell-Responsive Synthetic Hydrogels," Adv. Mater., vol. 15, No. 11, Jun. 2003, pp. 888-892.

Wu, C.Y., et al., "Self-Assembled Two-Dimensional Block Copolymers on Pre-patterned Templates with Laser Interference Lithography," IEEE, 2007, pp. 153-154.

Zhu, X.Y., et al., "Molecular Assemblies on Silicon Surfaces via Si-O Linkages," Langmuir, vol. 16, 2000, American Chemical Society, pp. 6766-6772. [Published on Web Jul. 29, 2000].

Ali, H.A., et al., Solid-State Electronics 46 (2002), 1639-1642.

Arshady et al., Makromol. Chem., 1976, vol. 177, p. 2911-2918.

Bae, Joonwon, Surface Modification Using Photo-Crosslinkable Random Copolymers, Abstract submitted for the Mar. 2006 meeting of The American Physical Society, submitted Nov. 30, 2005.

Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., Abstract submitted for the Mar. 6 meeting of the American Physical Society, submitted Nov. 2005 (online), accessed via the Internet (retrieved on Apr. 5, 2010), URL: <http://absimage.aps.org/image/MWS_MAR06-2005-003641.pdf>.

Bang, Joona, The Effect of Humidity on the Ordering of Tri-block Copolymer Thin Films, Abstract submitted for the Mar. 2007 meeting of The American Physical Society, submitted Nov. 20, 2006.

Bass, Robert B., et al., Microcontact Printing with Octadecanethiol, Applied Surface Science, 226(4), pp. 335-340, Apr. 2004, http://www.ece.virginia.edu/UVML/sis/Papers/rbbpapers/assoct.pdf.

Bearinger, J.P., et al., Nature Materials 2, 259-264, 2003.

Berry, B.C., et al., Effects of Zone Annealing on Thin Films of Block Copolymers, National Institute of Standard and Technology, Polymers Division, Gaithersburg, MD., 2007.

Black, C.T., IEEE 2005 Custom Integrated Circuits Conference, pp. 87-91.

Black, C.T., Applied Physics Letters 87, 163116-1 to 1163116-3, 2005.

Black, C.T., et al., IBM J. Res. & Dev., vol. 51, No. 5, Sep. 2007, pp. 605-633.

Black, C.T., Proc. of SPIE, vol. 6153, 615302 (2006).

Black, Charles T., IEEE Transactions on Nanotechnology, vol. 3, No. 3, Sep. 2004, pp. 412-415.

Black, Charles T., ACSNano, vol. 1, No. 3, 2007, American Chemical Society, pp. 147-150.

Black, Charles T., et al., IEEE Electronon Device Letters, vol. 25, No. 9, Sep. 2004, pp. 622-624.

Botelho do Rego, A.M., et al., Surface Science, 482-485 (2001), pp. 1228-1234.

Brydson, Rik M., et al. (chapter authors), Generic Methodologies for Nanotechnology: Classification and Fabrication, Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Bulpitt, Paul et al, Journal of Biomedical Materials Research, vol. 47,

Issue 2, pp. 152-169, Abstract only.

Canaria, Christi A., et al., Formation and Removal of Alkylthiolate Self-Assembled Monolayers on Gold in Aqueous Solutions, Lab Chip 6, 289-295 (2006), http://www.rsc.org/publishing/journals/LC/article.asp?doi=b51066c] (Abstract).

Candau et al., Polymer, 1977, vol. 18, p. 1253-1257.

Cavicchi, Kevin A., et al., Macromolecules 2007, vol. 40, 2007, pp. 1181-1186.

Chandekar, Amol, et al., Template-Directed Adsorption of block Copolymers on Alkanethiol-Patterned Gold Surfaces, (circa 2006), http://www.nano.neu.edu/industry/industry_showcase/industry_day/documents/Chandekar.pdf) (Powerpoint template for scientific posters (Swarthmore College)).

Cheng, Joy T., et al., Nano Letters, vol. 0, No. 0, A-E, published on Web Aug. 16, 2006.

Cheng, Joy Y., et al., Nano Letters, vol. 6, No. 9, 2006, pp. 2009-2103.

Cheng, Joy Y., et al., Adv. Mater. 2003, vol. 15, No. 19, pp. 1599-1602.

Cheng, Joy Y., et al., Applied Physics Letters, 91, 143106-143106-3 (2007).

Daoulas Kostas Ch., et al., Physical Review Letters 96, week ending Jan. 27, 2006, pp. 036104-1-3.

Darling, S.B., Progress in Polymer Science, vol. 32, No. 10, Sep. 28, 2007, pp. 1152-1204.

Desai, Dr. Trejal A., et al., Business Briefing: Medical Device Manufacturing & Technology, 2002.

Edwards, Erik W., et al., Journal of Polymer Science: Part B Polymer Physics, vol. 43, 3444-3459, 2005.

Edwards, Erik W., et al., Advanced Mater, 16, No. 15, Aug. 4, 2004, pp. 1315-1319.

Elisseeff J., et al., Journal of Biomedical Materials Research, 51(2): 164-171, Aug. 2000, Abstract only.

Fasolka, Michael J. et al., Macromolecules 2000, vol. 33, No. 15, pp. 5702-5712.

Gates, Byron D., et al., Annu. Rev. Mater. Res. 2004, 34:339-72.

Ge, Zhenbin, et al., PRL 96, 186101-1 186101-4, The American Physical Society, week ending May 12, 2006.

Gelest Inc., Silane Coupling Agents: Connecting Across Boundaries, pp. 1-56, 2006.

Genua, A., et al., Nanotechnology, 18 (2007), pp. 1-7.

Gillmor, S.D., et al., Langmuir 2000, vol. 16, No. 18, 2000, pp. 7223-7228.

Gudipati, Chakravarthy S., et al., Journal of Polymer Science Part A: Polymer Chemistry, vol. 42, pp. 6193-6208.

Guo, Kai, et al., Abstract of Synthesis and Characterization of Novel Biodegradable Unsaturated Poly(ester amide)/ Poly(ethylene glycol) Diacrylate Hydrogels, Journal of Polymer Science Part A: Polymer Chemistry, vol. 43, Issue 17, pp. 3932-3944, 2005 Wiley Periodicals, Inc.

Hamley, I. W., Introduction to Block Copolymers, Developments in Block Copolymers Science and Technology, 2004, John Wiley & Sons, Ltd., pp. 1-29.

Harrison, Christopher et al., Polymer, vol. 39, No. 13, pp. 2733-2744, 1998.

Hawker, et al., Facile Synthesis of Block Copolymers for Nanolithographic Applications; Polymer Reprints, 2005.

He, Yiyong et al., J. Am. Chem. Soc. 2006, 128, 2745-2750.

Hermans, Thomas M., et al., Application of Solvent-Directed Assembly of Block Copolymers to the Synthesis of Nanostructured Materials with Low Dielectric Constants, Angewandte Chem. Int. Ed. 2006, 45, pp. 6648-6652.

Hutchison, J. Brian, et al., Chem. Mater., vol. 17, No. 19, 2005, pp. 4789-4797.

In, Insik, et al., Langmuir, vol. 22, No. 18, 2006, pp. 7855-7860.

Ji, Shengxiang, et al., Preparation of Neutral Wetting Brushes for Block Copolymer Films from Homopolymer Blends, submitted to Advanced Materials, 20[16]: 3054-3060; published online Jul. 7, 2008.

Ji, Shengxiang, et al., Macromolecules, 2008, 41(23): 9098-9103.

Search Report of Taiwanese Patent Application No. 097121922, dated Oct. 16, 2011, 1 page.

Search Report of Taiwanese Patent Application No. 098108789, dated Dec. 18, 2012, 1 page.

Search Report of Taiwanese Patent Application No. 098109253, dated Aug. 22, 2012, 1 page.

Search Report of Taiwanese Patent Application No. 097110156, dated Mar. 22, 2012, 1 page.

Choi, H. J., et al., "Magnetorheology of Synthesized Core—Shell Structured Nanoparticle," IEEE Transactions on Magnetics, vol. 41, No. 10, Oct. 2005, pp. 3448-3450.

Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.

PCT International Search Report and Written Opinion of the International Searching Authority for PCT/US2009/041125, dated Sep. 10, 2010, 15 pages.

Search Report of the Taiwanese Application No. 098114513, issued Aug. 9, 2012, 3 pages.

Jun, et al., Langmuir, 2002, 18(9), pp. 3415-3417, Abstract only.

Karim, Alamgir et al., Control of Ordering Kinetics and Morphology Using Zone Annealing of Thin Block Copolymer Filmes, Abstract submitted for the Mar. 2007 Meeting of The American Physical Society, Nov. 20, 2006.

Kim, IS, et al., Int J Pharm., Sep. 15, 2000; 205(1-2): 109-16, Abstract only.

Kim, Sang Ouk, et al., Nature, vol. 424, Jul. 24, 2003, pp. 411-414.

Kim, Sang Ouk, et al., Adv. Mater., 2007, 19, pp. 3271-3275.

Kim, Seung Hyun, et al., Adv. Mater. 2004, 16, No. 3, Feb. 3, pp. 226-231.

Kim, Seung Hyun, et al., Macromolecules 2006, vol. 39, No. 24, 2006, pp. 8473-8479.

Kim, Seung Hyun, et al., Advanced Mater., vol. 16, No. 23-24, pp. 2119-2123, Dec. 17, 2004.

Kim, SH, J Biomater Appl., Jul. 2000; 15(1): 23-46 Abstract only.

Kim, SH, J Biomater Res., Mar. 15, 2000; 49(4): 517-27 Abstract only.

Kim, Su-Jin, et al., J. Vac. Sci. Technol. B26(1), Jan./Feb. 2008, 189-194.

Krishnamoorthy, Sivashankar, et al., MaterialsToday, vol. 9, No. 9, Sep. 2006, pp. 40-47.

La, Young-Hye, et al., Chem. Mater, 2007, vol. 19, No. 18, pp. 4538-4544.

La, Young-Hye, et al., J. Vac. Sci. Technol. B 25[6], Nov./Dec. 2007, pp. 2508-2513.

Laracuente, A.R., et al., Surface Science 545, 2003, pp. 70-84.

Lentz, David, et al., Whole Wafer Imprint Patterning Using Step and Flash Imprint Lithography: A Manufacturing Solution for Sub 100 nm Patterning, SPIE Advanced Lithography Paper, http://molecularimprints.com/ NewsEvents/tech_articles/new_articles/SPIE_07_MII_WW_Paper.pdf], Feb. 2007, pp. 1-10.

Li, Mingqi, et al., MaterialsToday, vol. 9, No. 9, Sep. 2006, pp. 30-39.

Li, Wai-kin, et al, J. Vac. Sci. Technol. B 25[6], Nov./Dec. 2007, pp. 1982-1984.

Li, Xue, et al., ScienceDirect, Polymer 48 [2007], pp. 2434-2443.

Lin, Zhiqun, et al., Adv. Mater. 2002, 14 No. 19, Oct. 2, pp. 1373-1376.

Lin-Gibson, Sheng, et al., Macromolecules 2005, 38, pp. 2897-2902.

Lutolf, M.P., et al, Nature Biotechnology, 23, 47-55 (2005), Abstract only.

Malkoch, Michael, et al., Chem. Commun., 2006, pp. 2774-2776.

Mansky, P., et al., Science, vol. 275, Mar. 7, 1997, pp. 1458-1460.

Martens, P., et al., Polymer, vol. 41, Issue 21, Oct. 2000, pp. 7715-7722, Abstract only.

Matsuda, T., et al., ASAIO J, Jul.-Sep. 1992; 38(3): M154-7, Abstract only.

Maye, Mathew A., et al., Journal of Chemical Education, vol. 79, No. 2, Feb. 2002, pp. 207-210.

Metiers, Andrew, et al., Biomacromolecules 2005, 6, pp. 290-301, 2005.

Meyer, Evelyn, et al., Macromollecular Mater. Eng., 276/277, 2000, pp. 44-50.

Mezzenga, Raffaele, et al., Langmuir 2003, vol. 19, No. 20, 2003, pp. 8144-8147.

Mindel, Joseph., et.al., A Study of Bredig Platinum Sols, The Chemical Laboratories of New York University, vol. 65 pp. 2112.

Nealey, Paul F., et al., Self-Assembling Resists for Nanolithography, IEEE 2005.
Naito, et al., IEEE Transactions on Magnetics, vol. 38, No. 5, Sep. 2002, pp. 1949-1951.
Nguyen, Kytai, et al., Biomaterials 23, 2002, pp. 4307-4314.
Nishikubo, T., American Chemical Society Symposium Series, 1997, p. 214-230.
Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).
Olayo-Valles, Roberto et al., J. Mater. Chem, 2004, 14, 2729-2731.
Parejo, Pilar Garcia, et al., J. Mater. Chem., 2006, 16, pp. 2165-2169.
Park, Cheolmin, et al., Polymer 44, 2003, 6725-6760.
Park, Dae-Ho, Nanotechnology 18, 2007, 355304, pp. 1-7.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124.
Peng, Juan et al., Macromol. Rapid Commun. 2007, 28, 1422-1428.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Ruiz, Ricardo, et al., Adv. Mater, 2007, 19, pp. 587-591.
Ruiz, Ricardo et al., Science, vol. 321, Aug. 15, 2008, pp. 936-939.
Ryu, Du Yeol, et al., Macromolecules, vol. 40, No. 12, 2007, pp. 4296-4300.
Saraf, Ravi R., et al., Applied Physics Letters, vol. 80, No. 23, Jun. 10, 2002, pp. 4425-4427.
Sawhney, Amarpreet S., et al., Macromolecules 1993, 26, 581-587, Abstract only.
Segalman, Rachel A., Materials Science and Engineering R 48 (2005), pp. 191-226.
Shahrjerdi, Davood, et al., IEEE Electron Device Letters, vol. 28, No. 9, Sep. 2007, pp. 793-796.
Sharma, Sadhana, et al., Applied Surface Science, 206 [2003], pp. 218-229.
Sivaniah, E., et al., Macromolecules 2003, 36, pp. 5894-5896.
Sivaniah, et al., Macromolecules 2005, 38, 1837-1849.
Solak, Harun H., Journal of Physics D: Applied Physics, 2006, pp. R171-188.
Srinvivasan, Charan, et al., ACS Nano, vol. 1, No. 3, pp. 191-201, 2007.
Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175.
Sundrani, Deepak, et al., Nano Lett., vol. 4, No. 2, 2004, pp. 273-276.
Sundrani, Deepak, et al., Langmuir 2004, vol. 20, No. 12, 2004, pp. 5091-5099.
Truskett, Van N., et al., TRENDS in Biotechnology, vol. 24, No. 7, Jul. 2006, pp. 312-315.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Wang, C., et al., Electrochimica Acta 52 (2006), pp. 704-709.
Wathier, Michel, et al., J. Am. Chem. Soc., 2004, 126 (40), pp. 12744-12745, Abstract only.
Winesett, D.A., et al., Langmuir 2003, 19, pp. 8526-8535.
Xiao, Shuaigang et al., Nanotechnology 16 (2005) S324-S329.
Xu, Ting et al., Polymer 42, [2001] 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582.
Yang, XiaoMin, et al., J. Vac. Sci. Technol. B 22[6], Nov./Dec. 2004, 3331-3334.
Yurt, Serkan, et al., Macromolecules 2006, vol. 39, No. 5, 2006.
Zhang, Mingfu, et al., Adv. Mater. 2007, 19, pp. 1571-1576.
Berry et al., Nano Letters vol. 7, No. 9, Aug. 2007, p. 2789-2794.
Fukunaga et al., Macromolecules vol. 39, Aug. 2006, p. 6171-6179.
Hammond et al., Macromoleculars vol. 38, Jul. 2005, p. 6575-6585.
Knoll et al., "Phase Behavior in Thin Films of Cylinder-Forming Block Copolymers", Physical Review Letters, vol. 89, No. 3, Jul. 2002.
Zehner, et al., Langmuir, vol. 14, No. 2, pp. 241-244, Jan. 20, 1998.
Cha, Jennifer N., et al., Chem. Mater. 2007, 19, 839-843.
Chang, Li-Wen, Proc. of SPIE, vol. 6156, 2006, 615611-1 to 615611-6.
Chang, Li-Wen, IEEE International Electron Devices Meeting (IEDM), paper 33.2, Dec. 6-8, San Francisco, 2010, pp. 33.2.1-33.2.4.
Ikeda, Susumu et al., NanotechJapan Bulletin—vol. 3, No. 3, Dec. 17, 2010/Focus 26-06.
Ji, Shengxiang et al., ACS Nano, vol. 4, No. 2, 2010, pp. 599-609.
Metters, Andrew, et al., Biomacromolecules 2005, 6, pp. 290-301, 2005.
Park, Seung Hak, et al., Soft Matter, 2010, 6, 2010, 120-125.
Wipf, "Handbook of Reagents for Organic Synthesis", 2005, John Wiley & Sons Ltd., p. 320.
Yamaguchi, Toru, et al., Microprocesses and Nanotechnology, 2007, Conference date Nov. 5-8, 2007, pp. 434-435.
Zhang, Yuan et al., Applied Physics Letter, 91, 013104, 2007, pp. 013104 to 013104-3.

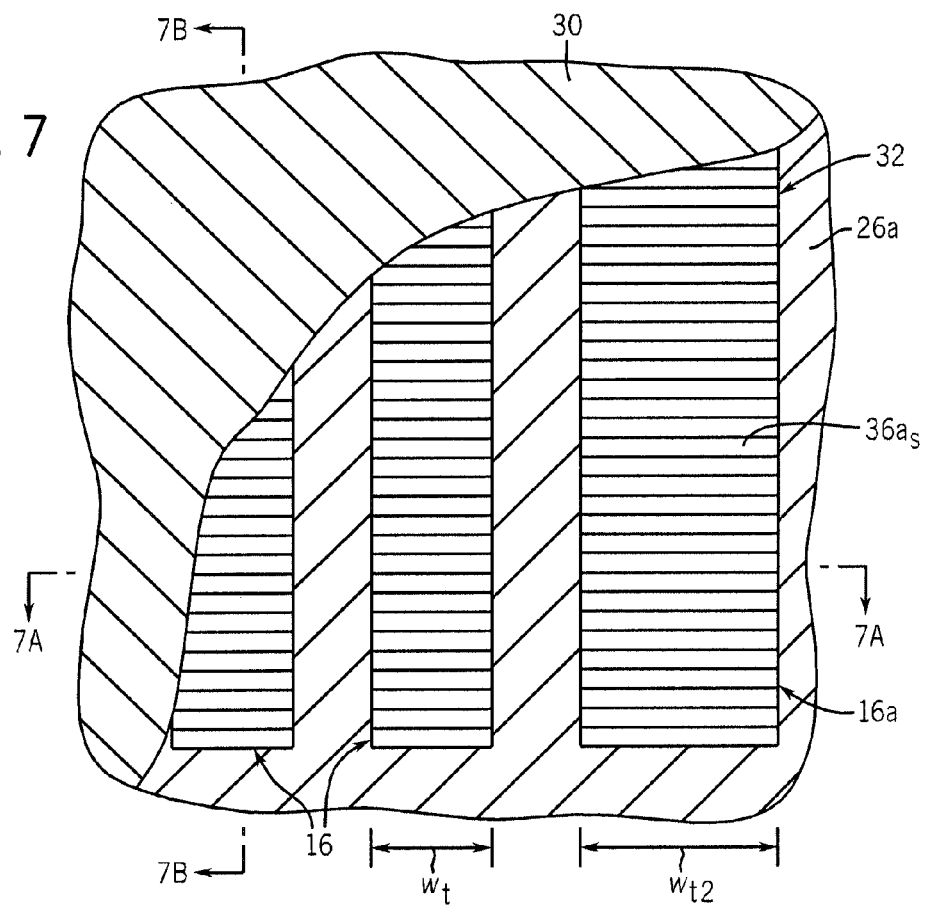
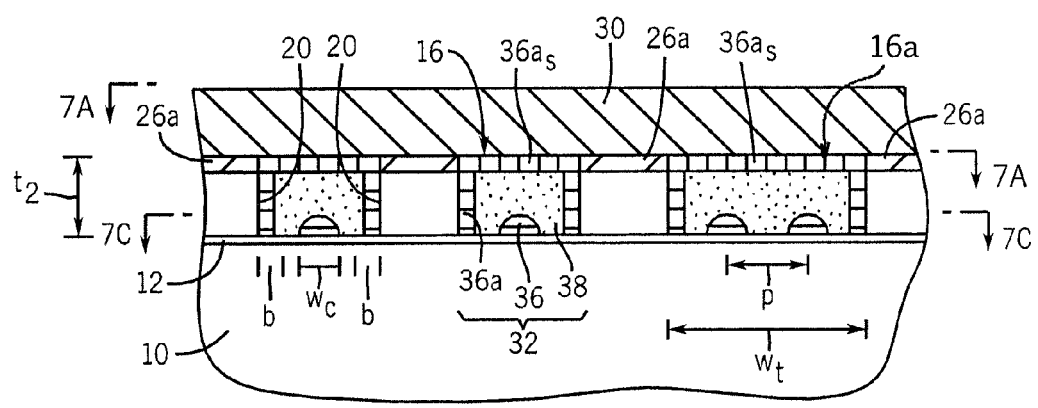

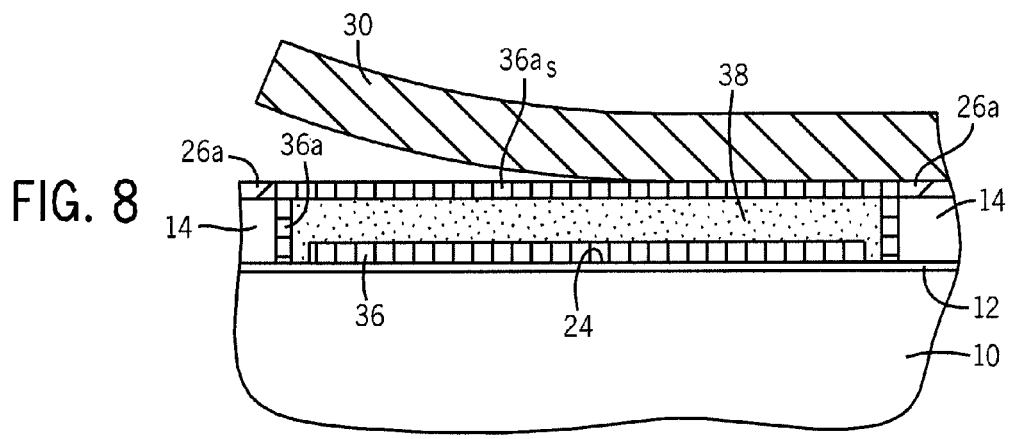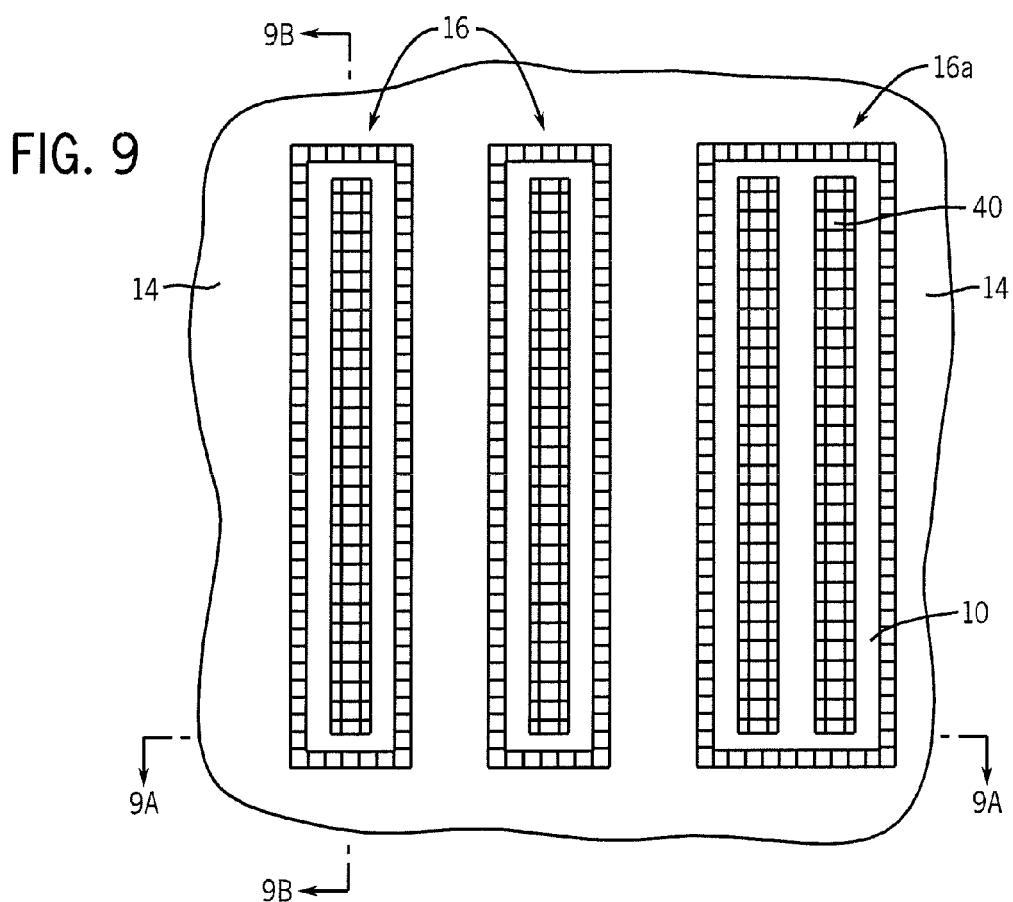

GRAPHOEPITAXIAL SELF-ASSEMBLY OF ARRAYS OF DOWNWARD FACING HALF-CYLINDERS

CROSS REFERENCE TO RELATED APPLICATION

This application is a divisional of U.S. patent application Ser. No. 12/114,173, filed May 2, 2008, now U.S. Pat. No. 8,114,301, issued Feb. 14, 2012.

TECHNICAL FIELD

Embodiments of the invention relate to methods of fabricating thin films of self-assembling block copolymers, and devices resulting from those methods.

BACKGROUND

As the development of nanoscale mechanical, electrical, chemical and biological devices and systems increases, new processes and materials are needed to fabricate nanoscale devices and components. Making electrical contacts to conductive lines has become a significant challenge as the dimensions of semiconductor features shrink to sizes that are not easily accessible by conventional lithography. Optical lithographic processing methods have difficulty fabricating structures and features at the sub-60 nanometer level. The use of self-assembling diblock copolymers presents another route to patterning at nanoscale dimensions. Diblock copolymer films spontaneously assemble into periodic structures by microphase separation of the constituent polymer blocks after annealing, for example, by thermal annealing above the glass transition temperature of the polymer or by solvent annealing, forming ordered domains at nanometer-scale dimensions.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into periodic spherical domains with spheres of polymer B surrounded by a matrix of polymer A. For ratios of the two blocks between about 60:40 and 80:20, the diblock copolymer assembles into periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5 to 50 nm.

A lamellar-phase block copolymer material has been used for making line features on a substrate. However, cylinders self-assemble more rapidly and correct defects faster than lamellae. Researchers have reported producing lines of upward-facing, half-cylinders of a minority block of a block copolymer in a matrix of the majority block through self-assembly of a cylindrical-phase morphology block copolymer on a chemically neutral surface. After removal of the matrix material, the half-cylinders form a masking structure over the underlying substrate. However, subsequent etching tends to undercut and isotropically etch the matrix material that remains under the half-cylinder lines, which will negatively affect etch resolution of the substrate. Applications for forming structures in an underlying substrate for semiconductor systems require a complex layout of elements for forming contacts, conductive lines and/or other elements, such as DRAM (dynamic random-access memory) capacitors.

It would be useful to provide methods of fabricating films of line arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, reference numerals are used in the drawings, and the same reference numerals are used throughout the several views and in the description to indicate same or like parts.

FIG. 7 is a top plan view of the substrate shown in FIG. 6 at a subsequent stage, showing a cutaway of the preferential wetting material over the surface of the self-assembled block copolymer material within the trenches. FIGS. 7A and 7B illustrate cross-sectional views of the substrate depicted in FIG. 7, taken along lines 7A-7A and 7B-7B, respectively.

FIG. 8 is a view of the substrate depicted in FIG. 7B at a subsequent stage showing removal of the preferential wetting material from the surface of the self-assembled block copolymer material according to an embodiment of the disclosure.

FIG. 9 is a top plan view of the substrate shown in FIG. 7 at a subsequent stage, showing the removal of one of the polymer domains of the self-assembled block copolymer material within the trenches.

DETAILED DESCRIPTION OF THE INVENTION

Figure 1:
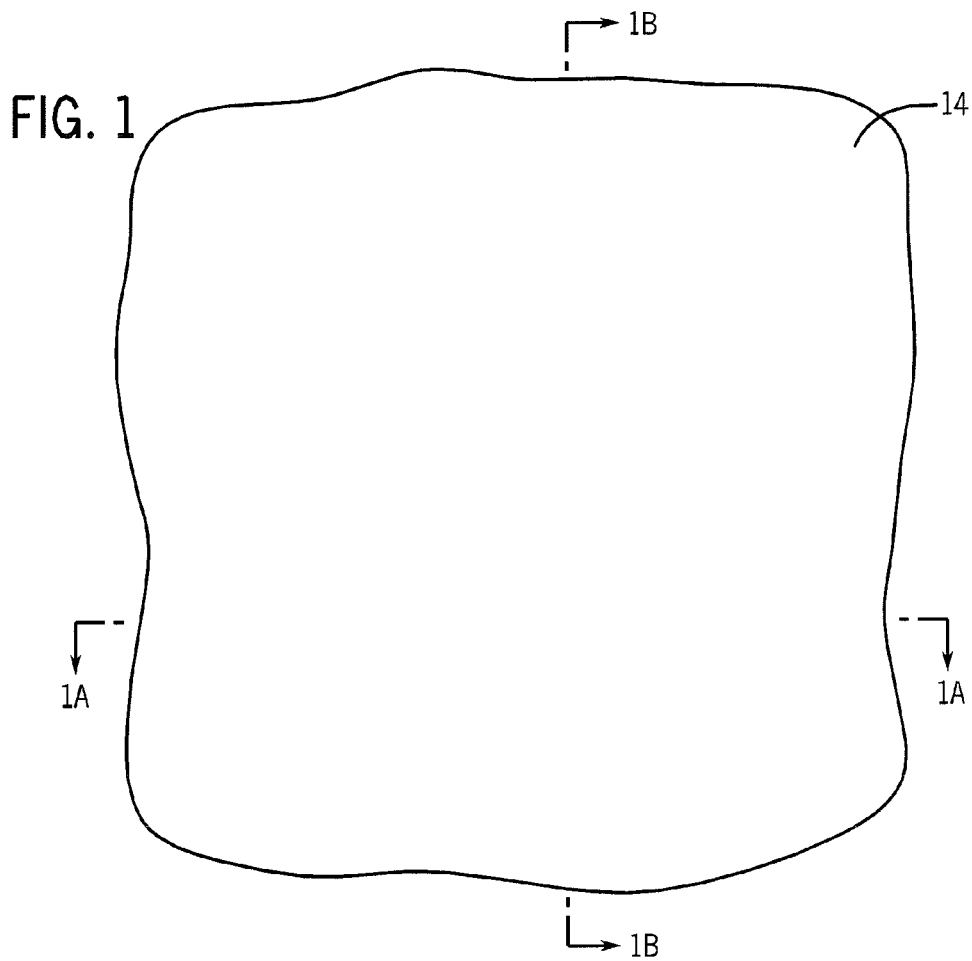
FIG. 1 illustrates a diagrammatic top plan view of a portion of a substrate at a preliminary processing stage according to an embodiment of the present disclosure, showing the substrate with a neutral wetting material thereon.
Figure 1A:
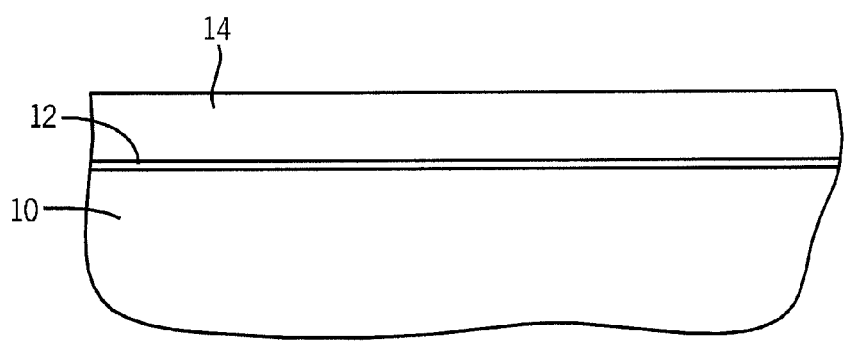
FIGS. 1A and 1B are elevational, cross-sectional views of the substrate depicted in FIG. 1 taken along lines 1A-1A and 1B-1B, respectively.

The following description with reference to the drawings provides illustrative examples of devices and methods according to embodiments of the invention. Such description is for illustrative purposes only and not for purposes of limiting the same.

In the context of the current application, the terms "semiconductor substrate," "semiconductive substrate," "semiconductive wafer fragment," "wafer fragment," or "wafer" mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" as used herein is the inherent periodicity or pitch value (bulk period or repeat unit) of structures that self-assemble upon annealing from a self-assembling (SA) block copolymer. "$L_B$" as used herein is the periodicity or pitch value of a blend of a block copolymer with one or more of its constituent homopolymers. "L" is used herein to indicate the center-to-center cylinder pitch or spacing of cylinders of the block copolymer or blend, and is equivalent to "$L_o$" for a pure block copolymer and "$L_B$" for a copolymer blend.

In embodiments of the invention, a polymer material (e.g., film, layer) is prepared by guided self-assembly of block copolymers, with both polymer domains wetting the interface with the trench floor. Block copolymer materials spontaneously assemble into periodic structures by microphase separation of the constituent polymer blocks after annealing, forming ordered domains at nanometer-scale dimensions. In embodiments of the invention, one or more rows or lines of parallel-oriented half-cylinders are formed within a trench, with the face of the half-cylinder lines wetting a chemically neutral trench floor. Following self-assembly, the parallel-oriented line(s) formed on the substrate can then be used, for example, as an etch mask for patterning nanometer-scale line openings into the underlying substrate through selective removal of one block of the self-assembled block copolymer. Since the domain sizes and periods (L) involved in this method are determined by the chain length of a block copolymer (MW), resolution can exceed other techniques such as conventional photolithography. Processing costs using the technique are significantly less than extreme ultraviolet (EUV) photolithography, which has comparable resolution.

A method for fabricating a self-assembled block copolymer material that defines an array of nanometer-scale, parallel-oriented, downward facing half-cylinder lines according to an embodiment of the invention is illustrated in FIGS. 1-9.

The described embodiment involves an anneal of a cylindrical-phase block copolymer in combination with a graphoepitaxy technique that utilizes a lithographically defined trench as a guide with a floor composed of a material that is neutral wetting to both polymer blocks and sidewalls and ends that are preferential wetting to one polymer block and function as constraints to induce self-assembly of the block copolymer material. In some embodiments, an overlying material layer that is preferential wetting is placed over the block copolymer material in the trench. In other embodiments, an air interface can selectively wet the desired block. Upon annealing, the block copolymer material will self-assemble into one or more rows or lines of half-cylinders in a polymer matrix and registered to the trench sidewalls, with the face of the half-cylinders oriented downward and wetting the trench floor. In some embodiments, an ordered array of two or more rows of half-cylinders can be formed in each trench.

Figure 1B:

As depicted in FIGS. 1-1B, a substrate 10 is provided, which can be silicon, silicon oxide, silicon nitride, silicon oxynitride, silicon oxycarbide, among other materials.

Figure 2:
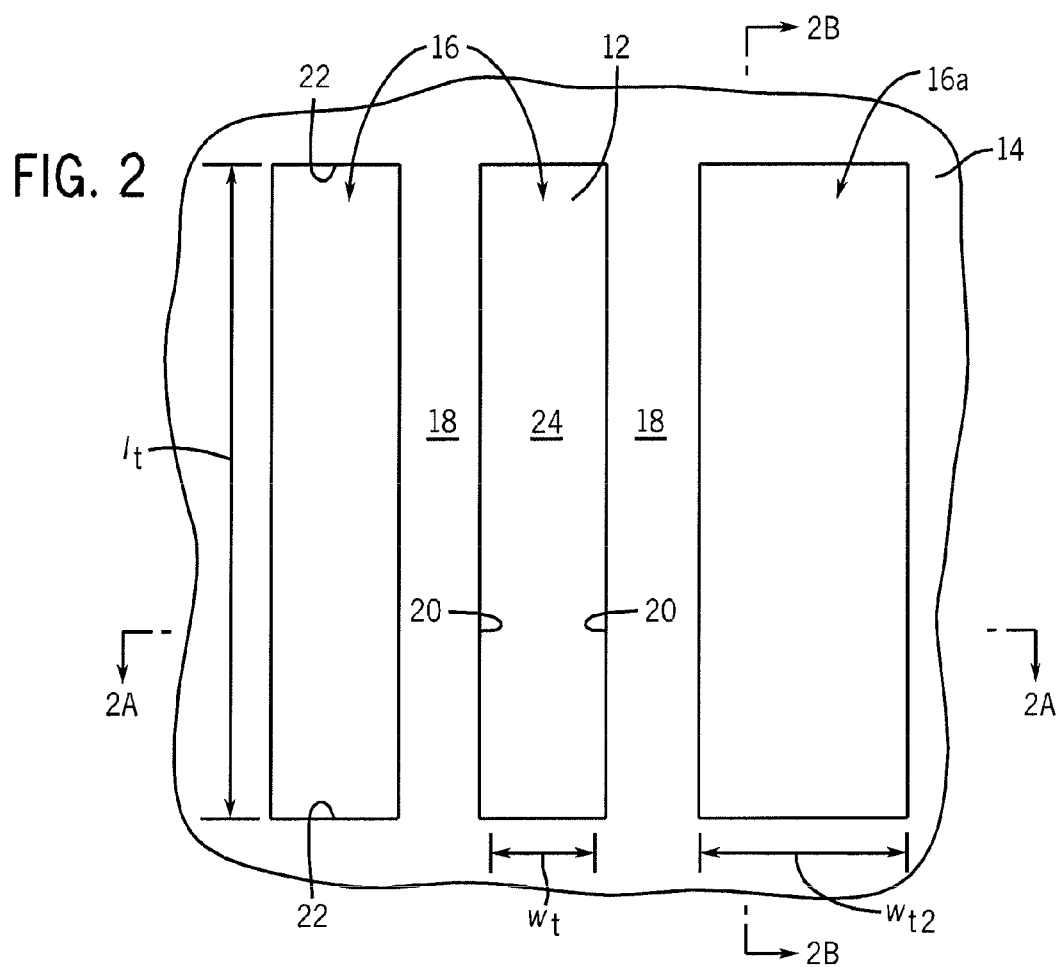
FIG. 2 illustrates a diagrammatic top plan view of the substrate of FIG. 1 at a subsequent stage showing the formation of trenches in a material layer formed on the neutral wetting material.
Figure 2A:
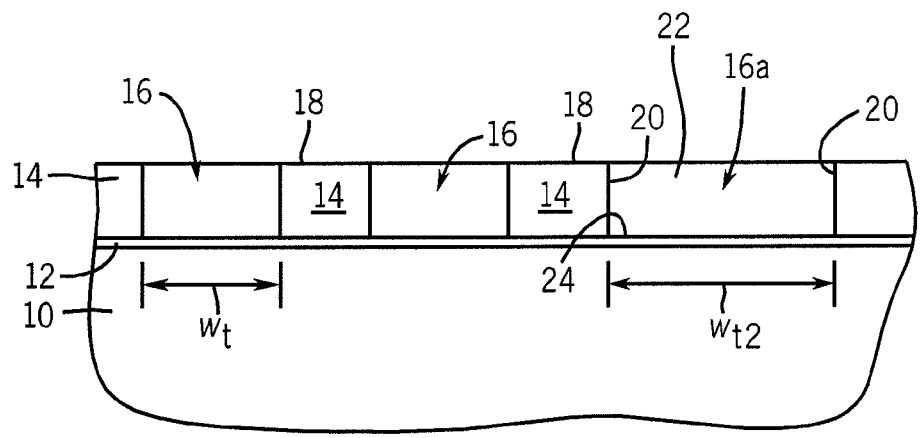
FIGS. 2A and 2B illustrate elevational, cross-sectional views of a portion of the substrate depicted in FIG. 2 taken, respectively, along lines 2A-2A and 2B-2B.
Figure 2B:
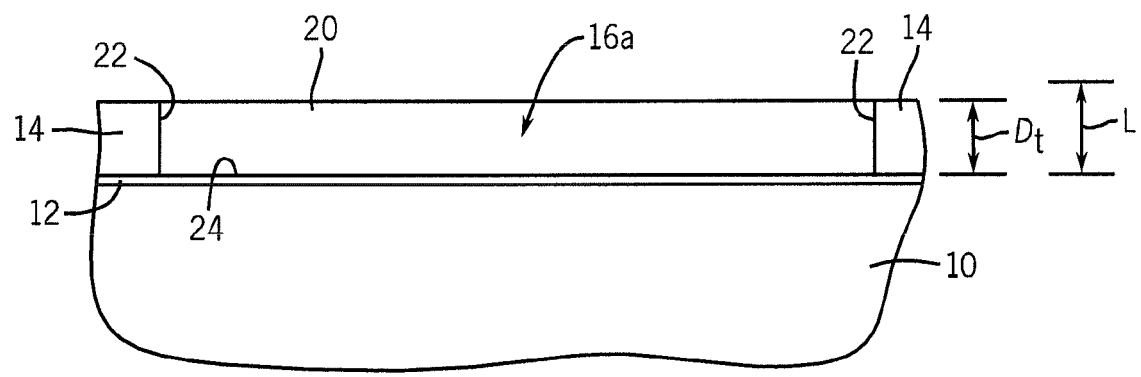

In the illustrated embodiment, a neutral wetting material 12 (e.g., random copolymer, blend of functionalized homopolymers, etc.) has been formed over the substrate 10. A material layer 14 (or one or more material layers) can then be formed over the neutral wetting material and etched to form trenches 16, 16a, as shown in FIGS. 2-2B. Portions of the material layer 14 form a spacer 18 outside and between the trenches 16, 16a. The trenches 16, 16a are structured with opposing sidewalls 20, opposing ends 22, a floor 24, a width ($w_t$, $w_{t2}$), a length ($l_t$) and a depth ($D_t$).

Figure 3:
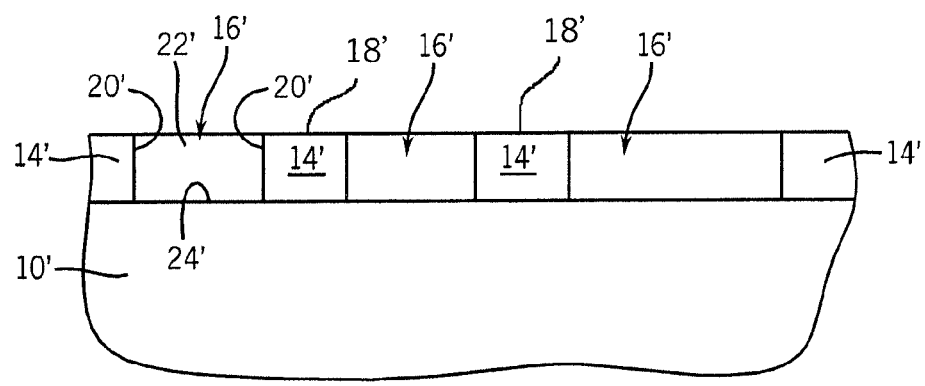
FIG. 3 illustrates a side elevational view of a portion of a substrate at a preliminary processing stage according to another embodiment of the disclosure, showing the substrate with trenches in a material layer formed on the substrate.
Figure 4:
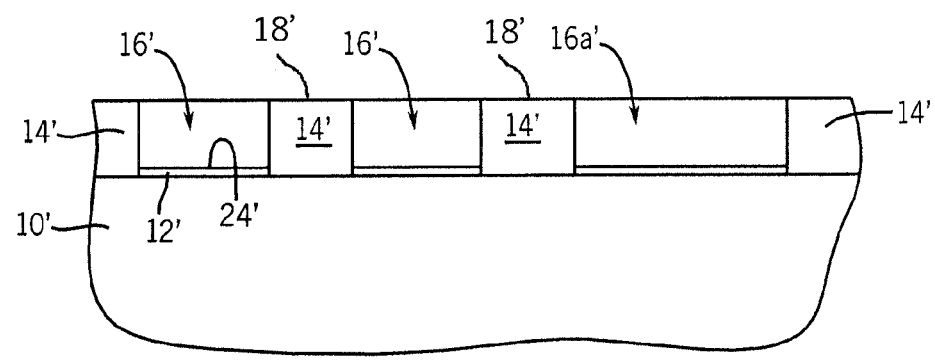
FIG. 4 illustrates a side elevational view of the substrate of FIG. 3 at a subsequent stage showing the formation of a neutral wetting material within the trenches.

In another embodiment illustrated in FIGS. 3 and 4, the material layer 14' can be formed on the substrate 10', etched to form the trenches 16', 16a', and a neutral wetting material 12' can then be formed on the trench floors 24'. For example, a random copolymer material can be deposited into the trenches 16', 16a' and crosslinked or grafted to form a neutral wetting material layer. Material on surfaces outside the trenches 16', 16a', such as on spacers 18' (e.g., non-crosslinked random copolymer) can be subsequently removed.

Single or multiple trenches 16, 16a (as shown) can be formed using a lithographic tool having an exposure system capable of patterning at the scale of L (10 to 100 nm). Such exposure systems include, for example, extreme ultraviolet (EUV) lithography, proximity X-rays and electron beam (e-beam) lithography, as known and used in the art. Conventional photolithography can attain (at smallest) about 58 nm features.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev et al.), U.S. Patent Publication No. 2006/0281266 (Wells) and U.S. Patent Publication No. 2007/0023805 (Wells). Briefly, a pattern of lines is photolithographically formed in a photoresist material overlying a layer of an expendable material, which in turn overlies a substrate, the expendable material layer is etched to form placeholders or mandrels, the photoresist is stripped, spacers are formed on the sides of the mandrels, and the mandrels are then removed leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or less.

Factors in forming a single line or multiple lines of parallel-oriented half-cylinders within the trenches include the width ($w_t$) of the trench, the formulation of the block copolymer or blend to achieve the desired pitch (L), and the thickness (t) of the block copolymer material.

There is a shift from two lines to one line of the half-cylinder lines as the width of the trench is decreased (e.g., from width $w_{t2}$ to width $w_t$) and/or the periodicity (L value) of the block copolymer is increased, for example, by forming a ternary blend by the addition of both constituent homopolymers. The boundary conditions of the trench sidewalls 20 in both the x- and y-axis impose a structure wherein each trench contains "n" number of features (e.g., n lines of half-cylinders).

In the illustrated embodiment shown in FIGS. 2-2B, trenches 16 are constructed with a width ($w_t$) of about 1.5 to 2 times L (or 1.5-2× the pitch value) of the block copolymer material 26 such that a cast block copolymer material (or blend) of about L will self-assemble upon annealing into a single parallel-oriented, downward-facing half-cylinder line (line width at or about 0.5 times L) that is aligned with the sidewalls 20 down the center of each trench 16. A relatively wider trench 16a has been formed with a width ($w_{t2}$) of (n+1)*L such that the block copolymer material 26 (or blend) of about L will self-assemble into n lines of downward-facing half-cylinders (line width≃ about 0.5 times L) at a center-to-center pitch distance (p) of adjacent lines at or about the L value of the block copolymer material 26. For example, the width ($w_{t2}$) of a wider trench 16a can be about 3 to 65 times L to result in the formation of 2 to 64 rows, respectively, of the downward-facing half-cylinders.

For example, in using a cylindrical-phase block copolymer with an about 50 nm pitch value or L, in trenches 16 with a width ($w_t$) of about 1.5 to 2 times 50 nm or about 75 nm to 100 nm, the block copolymer material will form a single downward-facing half-cylinder having a line width of about 25 nm. In trench 16a with a width ($w_{t2}$), for example, of about 3 times L or about 3 times 50 nm (or about 150 nm), the block copolymer material will form two rows of the half-cylinder structures (line width of about 2 5nm) at a center-to-center pitch distance (p) of adjacent half-cylinder lines of about the L value (about 50 nm).

In another example, with a cylindrical-phase block copolymer or blend having a pitch or L value of 35 nm, a single line of about 17.5 nm wide (about 0.5 times L) of a downward facing half-cylinder will form in trench 16 having a width ($w_t$) of about 1.5 to 2 times L or about 52.5 nm to 70 nm wide, and two parallel lines of half-cylinders (each about 17.5 nm wide) at a center-to-center pitch distance (p) of about 35 nm will form in trench 16a having a width ($w_{t2}$) of about 3 times L or about 3 times 35 nm (or about 105 nm).

The length ($l_t$) of the trenches 16, 16a is according to the desired length of the half-cylinder line(s).

The depth ($D_t$) of the trenches 16, 16a is effective to direct lateral ordering of the block copolymer material during the anneal. In embodiments of the invention, the trench depth can be at or less than the final thickness ($t_2$) of the block copolymer material ($D_t \leq t_2$), which minimizes the formation of a meniscus and variability in the thickness of the block copolymer material across the trench width. In some embodiments, the trench depth is at about two-thirds (⅔) to about three-fourths (¾), or about 67% to 75% less than the final thickness ($t_2$) of the block copolymer material within the trench.

In some embodiments, the dimensions of the trenches 16, 16a are a width of about 20 nm to 100 nm (trench 16, $w_t$) and about 20 nm to 3200 nm (trench 16a, $w_{t2}$), a length ($l_t$) of about 100 μm to 25,000 μm, and a depth ($D_t$) of about 10 nm to 100 nm.

Figure 5:
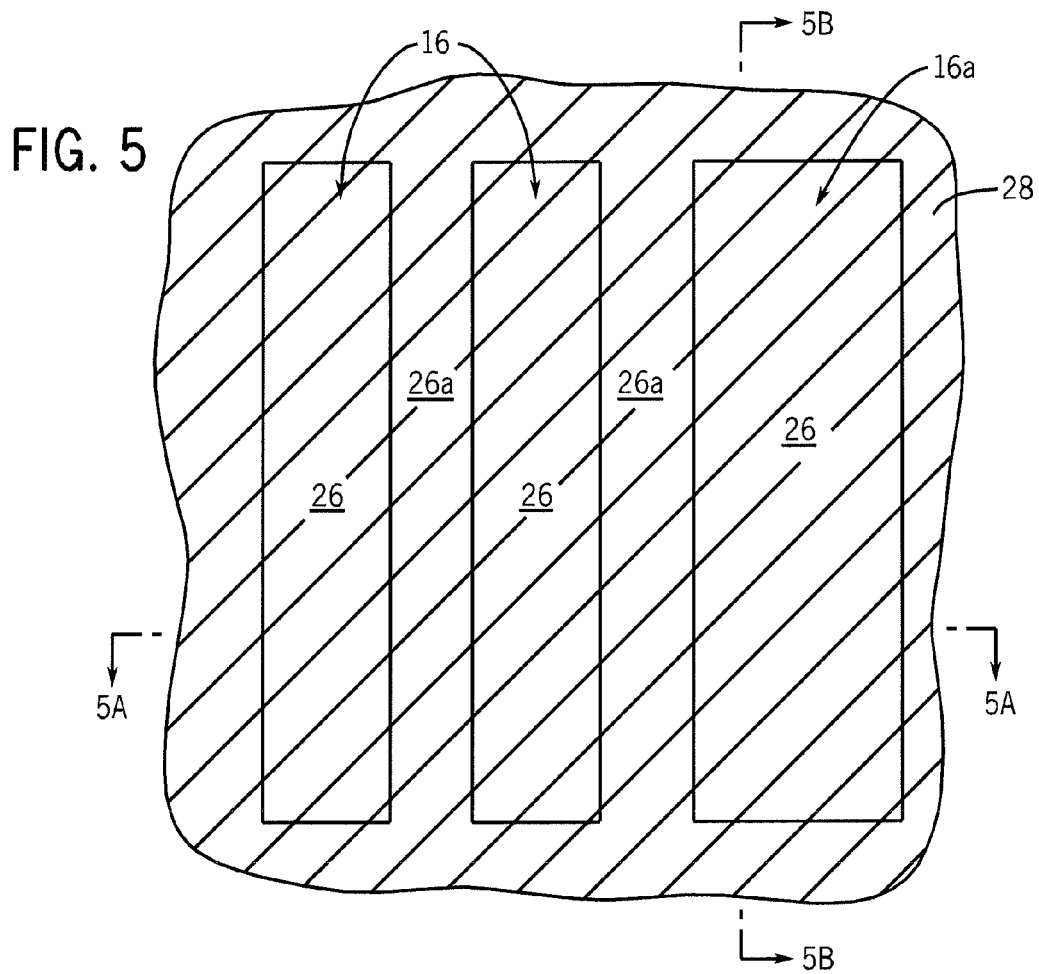
FIG. 5 is a diagrammatic top plan view of the substrate of FIG. 2 at a subsequent stage in the fabrication of a self-assembled, cylindrical phase, block copolymer film within the trenches according to an embodiment of the disclosure.
Figure 5A:
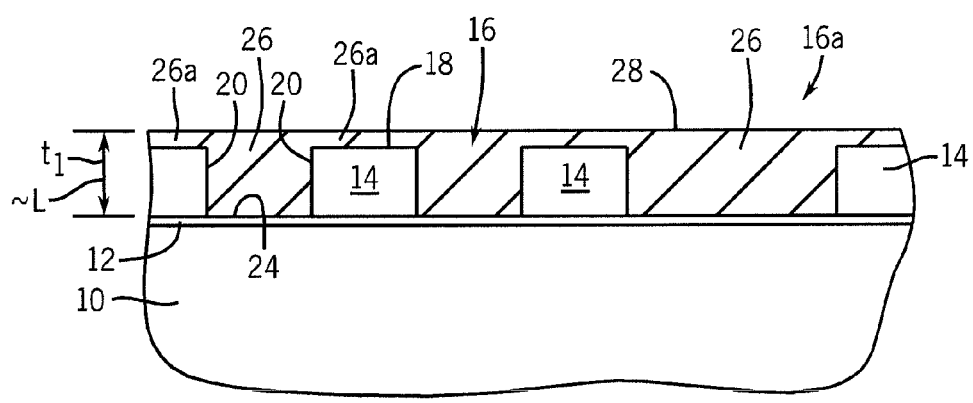
FIGS. 5A and 5B illustrate elevational, cross-sectional views of a portion of the substrate depicted in FIG. 5 taken along lines 5A-5A and 5B-5B, respectively.
Figure 5B:
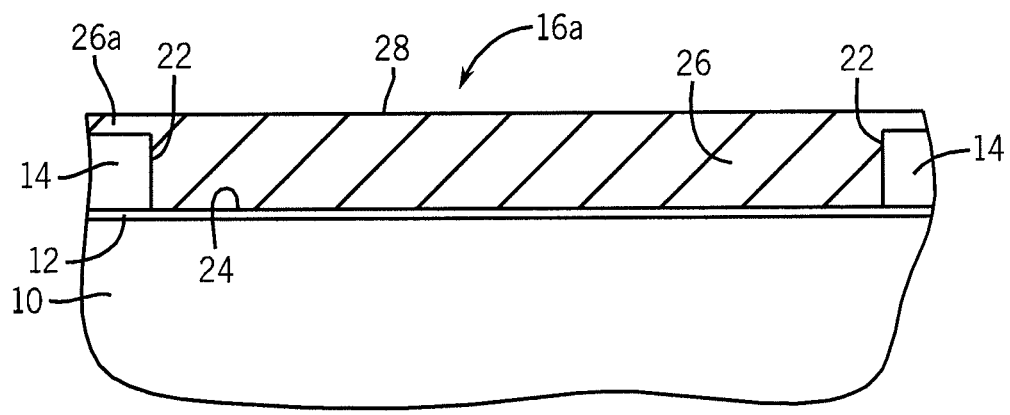

As depicted in FIGS. 5-5B, a self-assembling, cylindrical-phase block copolymer material 26 having an inherent pitch at or about $L_o$ (or a ternary blend of block copolymer and homopolymers blended to have a pitch at or about $L_B$) is deposited into the trenches 16, 16a. A thin layer or film 26a of the block copolymer material 26 can be deposited onto the material layer 14 outside the trenches 16, 16a, e.g., on the spacers 18.

The block copolymer material 26 or blend is constructed such that all of the polymer blocks will have equal preference for a neutral wetting material on the trench floor 24. In some embodiments of the invention, the block copolymer or blend is constructed such that the major domain can be selectively removed. In other embodiments, the minor domain polymer block can be selectively doped or structured to incorporate an inorganic component or species (e.g., a filler component) during annealing into microphase domains, which will remain on the substrate 10 as an etch resistant material (e.g., mask) upon selective removal of the majority polymer domain or, in some embodiments, both the majority and minority polymer domains. Suitable inorganic precursors are thermally stable and do not volatilize at the anneal temperature.

Block copolymers that incorporate an inorganic species can be prepared by techniques known in the art, for example, by a direct synthesis technique, or by incorporating atoms of an inorganic species by complexation or coordination with a reactive group of one of the polymer blocks.

For example, as described in U.S. Pat. No. 6,565,763 (Asakawa et al.), the block copolymer can be blended with an inorganic heat resistant material or precursor thereof, which will segregate to one polymer phase, for example, a metal salt, a metal oxide gel, metal alkoxide polymers, metal oxide precursor, metal nitride precursor, and metal fine particles. Examples of the metal include silicon (Si), chromium (Cr), titanium (Ti), aluminum (Al), molybdenum (Mo), gold (Au), platinum (Pt), ruthenium (Ru), zirconium (Zr), tungsten (W), vanadium (V), lead (Pb), and zinc (Zn), among others.

Examples of metal alkoxides include alkoxysilanes such as tetramethoxysilane, tetraethoxysilane, tetraisopropoxysilane, tetraisopropoxyaluminum and tetraisopropoxytitanium, and alkylalkoxysilanes such as butyltriethoxysilane and propyltriethoxyaluminum. An example of the metal alkoxide polymer is polydiethoxysiloxane.

Examples of a metal oxide precursor or metal nitride precursor include polysilsesquioxane (e.g., polymethylsilsesquioxane, polymethylhydroxyl silsesquioxane, polyphenylsilsesquioxane, etc.), polyhedral oligomeric silsesquioxane (POSS), and polysilazane.

In some embodiments, a solution of a block copolymer can be combined with an additive such as an organic metal salt that has a high affinity to one of the polymer chains of the block copolymer and will segregate during an anneal to one of the polymer phases. For example, the block copolymer can be mixed with a metal salt combined with an organic compound. Examples of such organic metal salts include lithium 2,4-pentanedionate, lithium tetramethylpentanedionate, ruthenium 2,4-pentanedionate, magnesium 2,4-pentanedionate, magnesium hexafluoropentanedionate, magnesium trifluoropentanedionate, manganese(II) 2,4-pentanedionate, molybdenum(V) ethoxide, molybdenum(VI) oxide bis(2,4-pentanedionate), neodymium 6,6,7,7,8,8,8-heptafluoro-2,2-dimethyl-3,5-octanedionate, neodymium hexafluoropentanedionate, neodymium(III) 2,4-pentanedionate, nickel(II) 2,4-pentanedionate, niobium(V) n-butoxide, niobium(V) n-ethoxide, palladium hexafluoropentanedionate, palladium 2,4-pentanedionate, platinum hexafluoropentanedionate, platinum 2,4-pentanedionate, rhodium trifluoropentanedionate, ruthenium(III) 2,4-pentanedionate, tetrabutylammonium hexachloroplatinate(IV), tetrabromoaurate(III) cetylpyridinium salt, among others.

As described in U.S. Patent Publication No. 2007/0222995 and U.S. Patent Publication No. 2007/0289943 (Lu; Agilent Technologies Inc.), atoms of an inorganic species such as a metal (e.g., iron, cobalt, molybdenum, etc.) can be incorporated into one block of a diblock copolymer by complexation of the atoms of the inorganic species with the pyridine units of poly(styrene)-b-poly(vinylpyridine) (PS-b-PVP), where the pyridine group forms a coordination bond with the inorganic species, e.g., iron (Fe), etc., or forms as an acid-base conjugate. As an example of an acid-base conjugate, a solution of the PS-b-PVP block copolymer can be combined with dihydrogen hexachloroplatinate ($H_2PtCl_6$) wherein a single Pt atom can be complexed with each pyridine group (at maximum loading).

As also described in U.S. Patent Publication No. 2007/0222995, block copolymers that incorporate an inorganic species can also be prepared by a direct synthesis technique. For example, a sequential living polymerization of a non-metal-containing monomer (e.g., styrene monomer) followed by an inorganic species-containing monomer (e.g., ferrocenylethylmethylsilane monomer) can be used to synthesize an inorganic species-containing block copolymer (e.g., poly (styrene)-b-poly(ferrocenylmethylethylsilane) (PS-b-PFEMS).

Examples of diblock copolymers include, for example, poly(styrene)-b-poly(vinylpyridine) (PS-b-PVP), poly(styrene)-b-poly(methylmethacrylate) (PS-b-PMMA) or other PS-b-poly(acrylate) or PS-b-poly(methacrylate), poly(styrene)-b-poly(lactide) (PS-b-PLA), poly(styrene)-b-poly(tert-butyl acrylate) (PS-b-PtBA), and poly(styrene)-b-poly(ethylene-co-butylene (PS-b-(PS-co-PB)), and poly(styrene)-b-poly(ethylene oxide) (PS-b-PEO), polybutadiene-b-poly (vinylpyridine) (PB-b-PVP), poly(ethylene-alt-propylene)-b-poly(vinylpyridine) (PEP-b-PVP), among others, with PS-b-PVP diblock copolymers used in the illustrated embodiment. Other types of block copolymers (i.e., triblock or multiblock copolymers) can be used. Examples of triblock copolymers include ABC copolymers such as poly(styrene-b-methylmethacrylate-b-ethylene oxide) (PS-b-PMMA-b-PEO), and ABA copolymers such as PS-PMMA-PS, PMMA-PS-PMMA, and PS-b-PI-b-PS, among others.

Examples of diblock copolymers that incorporate an inorganic species include poly(styrene)-b-poly(dimethylsiloxane) (PS-b-PDMS), poly(isoprene)-b-poly(dimethylsiloxane) (PI-b-PDMS), PS-b-PFEMS, poly(isoprene)-b-poly (ferrocenylmethylethylsilane) (PI-b-PFEMS), poly(styrene)-b-poly(vinylmethylsiloxane) (PS-b-PVMS), poly(styrene)-b-poly(butadiene) (PS-b-PB) where the polybutadiene (PB) is stained by osmium tetroxide ($OSO_4$), and poly(styrene)-b-poly(vinylpyridine) (PS-b-PVP) where the pyridine group forms a coordination bond with an inorganic species, among others. After annealing and self-assembly of the polymer blocks into the half-cylinders and matrix, an oxidation process (e.g., ultraviolet (UV)-ozonation or oxygen plasma etching) can be performed to remove the organic components of the block copolymer domains and convert the inorganic species to form a non-volatile inorganic oxide, which remains on the substrate and can be used as a mask in a subsequent etch process. For example, the inorganic species of the PDMS and PFEM block copolymers are silicon and iron, which, upon oxidation, will form non-volatile oxides, e.g., silicon oxide ($SiO_x$) and iron oxide ($Fe_xO_y$).

The L value of the block copolymer can be modified, for example, by adjusting the molecular weight of the block copolymer. The block copolymer material can also be formulated as a binary or ternary blend comprising a block copolymer and one or more homopolymers (HPs) of the same type of polymers as the polymer blocks in the block copolymer, to produce a blend that will swell the size of the polymer domains and increase the L value. The concentration of homopolymers in a blend can range from 0 wt% to about 60 wt%. Generally, when added to a polymer material, both homopolymers are added to the blend in about the same ratio or amount. An example of a ternary diblock copolymer blend is a PS-b-PVP/PS/PVP blend, for example, 60 wt% of 32.5 K/12 K PS-b-PVP, 20 wt% of 10K PS, and 20 wt% of 10K PVP. Another example of a ternary diblock copolymer blend is a PS-b-PMMA/PS/PMMA blend, for example, 60 wt% of 46K/21K PS-b-PMMA, 20 wt% of 20K polystyrene and 20 wt% of 20K poly(methylmethacrylate). Yet another example is a blend of 60:20:20 (wt%) of PS-b-PEO/PS/PEO, or a blend of about 85 to 90 wt% PS-b-PEO and up to 10 to 15 wt% PEO homopolymer.

The film morphology, including the domain sizes and periods ($L_o$) of the microphase-separated domains, can be controlled by chain length of a block copolymer (molecular weight, MW) and volume fraction of the AB blocks of a diblock copolymer to produce cylindrical morphologies (among others). For example, for volume fractions at ratios of the two blocks generally between about 60:40 and 80:20, the diblock copolymer will microphase separate and self-assemble into periodic half-cylindrical domains of polymer B within a matrix of polymer A. An example of a cylinder-forming PS-b-PVP copolymer material ($L_o$~35 nm) to form about 20 nm wide half-cylindrical PVP domains in a matrix of PS is composed of about 70 wt% PS and 30 wt% PVP with a total molecular weight ($M_n$) of 44.5 kg/mol.

Figure 7B:
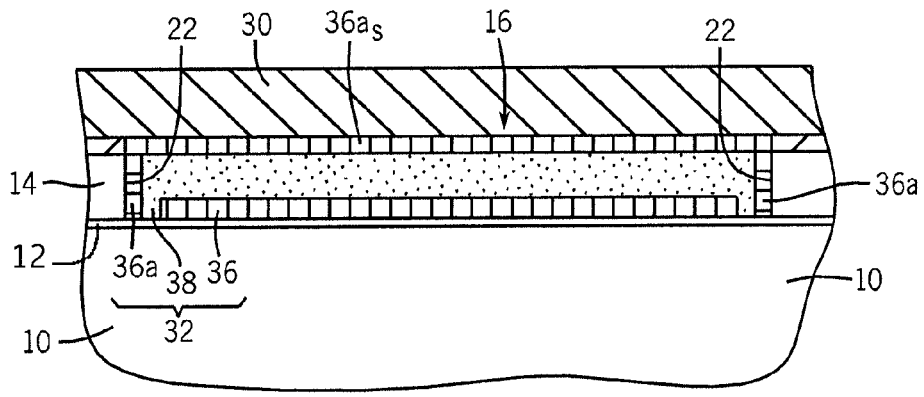

Referring to FIGS. 5-5B, the cylindrical-phase block copolymer material 26 can be cast or deposited into the trenches 16, 16a to an initial thickness ($t_1$) at or about the L value of the block copolymer material 26 (e.g., about ±20% of L) such that the thickness ($t_2$) after annealing will be at or below the L value and the block copolymer material 26 will self-assemble to form a single layer of downwardly facing half-cylinders registered parallel to the sidewalls 20 and extending the length ($l_t$) of each of the trenches 16, 16a (e.g., as in FIGS. 7A and 7B). The thickness of the block copolymer material 26 can be measured, for example, by ellipsometry techniques.

The block copolymer material 26 can be deposited by spin-casting (spin-coating) from a dilute solution (e.g., about 0.25 wt% to 2 wt % solution) of the copolymer in an organic solvent such as dichloroethane ($CH_2Cl_2$) or toluene, for example. Capillary forces pull excess block copolymer material 26 (e.g., greater than a monolayer) into the trenches 16, 16a. As shown, a thin layer or film 26a of the block copolymer material 26 can be deposited onto the material layer 14 outside the trenches 16, 16a, e.g., on the spacers 18. Upon annealing, the thin film 26a will flow into the trenches 16, 16a leaving a structureless brush layer on the material layer 14 from a top-down perspective.

In the present embodiment shown in FIGS. 5-5B, the trench floors 24 are structured to be neutral wetting (equal affinity for both blocks of the copolymer) to induce formation of half-cylinder polymer domains that are oriented facing downward on the trench floors 24, and the trench sidewalls 20 and the ends 22 are structured to be preferential wetting by one block of the block copolymer to induce registration of the half-cylinders to the sidewalls 20 as the polymer blocks self-assemble. Entropic forces drive the wetting of a neutral wetting surface by both blocks, and enthalpic forces drive the wetting of a preferential-wetting surface by the preferred block (e.g., the minority block).

A chemically neutral wetting trench floor 24 allows both blocks of the copolymer material to wet the floor 24 of the trenches 16, 16a and provides for the formation of the half-cylinder line layout of the disclosure. The use of a neutral wetting trench floor in embodiments of the invention expands the number of block copolymer materials that can be utilized to produce self-assembled films having a series of parallel lines formed on a substrate surface that can be readily used as a mask for etching the underlying substrate to form a multiple line layout on a nanoscale level.

A neutral wetting material 12 can be provided, for example, by applying a neutral wetting polymer (e.g., a neutral wetting random copolymer) onto the substrate 10, then forming an overlying material layer 14 and etching the trenches 16, 16a to expose the underlying neutral wetting material, as illustrated in FIGS. 2-2B.

In another embodiment illustrated in FIGS. 3 and 4, a neutral wetting random copolymer material can be applied after forming the trenches 16', 16a', for example, as a blanket coat by casting or spin-coating into the trenches 16', 16a' as depicted in FIG. 4. The random copolymer material can then be thermally processed to flow the material into the bottom of the trenches 16', 16a' by capillary action, which results in a layer (mat) 12' composed of the crosslinked, neutral wetting random copolymer. In another embodiment, the random copolymer material within the trenches 16', 16a' can be photo-exposed (e.g., through a mask or reticle) to crosslink the random copolymer within the trenches 16', 16a' to form the neutral wetting material 12'. Non-crosslinked random copolymer material outside the trenches 16', 16a' (e.g., on the spacers 18') can be subsequently removed.

Neutral wetting surfaces can be specifically prepared by the application of random copolymers composed of monomers identical to those in the block copolymer and tailored such that the mole fraction of each monomer is appropriate to form a neutral wetting surface. For example, in the use of a PS-b-PVP block copolymer, a neutral wetting material 12 can be formed from a thin film of a photo-crosslinkable random PS-r-PVP copolymer that exhibits non-preferential or neutral wetting toward PS and PVP, which can be cast onto the substrate 10 (e.g., by spin coating). The random copolymer material can be fixed in place by chemical grafting (on an oxide substrate) or by thermally or photolytically crosslinking (any surface) to form a mat that is neutral wetting to PS and PVP and insoluble when the block copolymer material is cast onto it, due to the crosslinking.

In another embodiment, a blend of hydroxyl-terminated homopolymers and a corresponding low molecular weight block copolymer can be grafted (covalently bonded) to the substrate to form a neutral wetting interface layer (e.g., about 4 nm to 5 nm) for PS-b-PMMA and PS-b-P2VP, among other block copolymers. The block copolymer can function to emulsify the homopolymer blend before grafting. For example, an about 1 wt% solution (e.g., in toluene) of a blend of about 20 wt% to 50 wt% (or about 30 wt% to 40 wt%) OH-terminated homopolymers (e.g., $M_n$=6K) and an about 80 wt% to 50 wt% (or about 70 wt% to 60 wt%) of a low molecular weight block copolymer (e.g., 5K-5K) can be spin-coated onto a substrate 10 (e.g., SiO$_2$), heated (baked) (e.g., at 160° C.), and the non-grafted (unbonded) polymer material may be removed, for example, by a solvent rinse (e.g., toluene). For example, the neutral wetting material can be prepared from a blend of about 30 wt% PS-OH ($M_n$=6K) and PMMA-OH ($M_n$=6K) (weight ratio of 4:6) and about 70 wt% PS-b-PMMA (5K-5K), or a ternary blend of PS-OH (6K), P2VP-OH (6K) and PS-b-2PVP (8K-8K), etc.

In embodiments in which the substrate 10 is silicon (with native oxide), a neutral wetting surface for PS-b-PMMA can be provided by hydrogen-terminated silicon. The floors 24 of the trenches 16, 16a can be etched, for example, with a hydrogen plasma, to remove the oxide material and form hydrogen-terminated silicon, which is neutral wetting with equal affinity for both blocks of a block copolymer material. H-terminated silicon can be prepared by a conventional process, for example, by a fluoride ion etch of a silicon substrate (with native oxide present, about 12 Å to 15 Å) by exposure to an aqueous solution of hydrogen fluoride (HF) and buffered HF or ammonium fluoride (NH$_4$F), by HF vapor treatment, or by a hydrogen plasma treatment (e.g., atomic hydrogen).

An H-terminated silicon substrate can be further processed by grafting a random copolymer such as PS-r-PVP, PS-r-PMMA, etc., selectively onto the substrate 10, resulting in a neutral wetting surface for the corresponding block copolymer (e.g., PS-b-PVP, PS-b-PMMA, etc.). For example, a neutral wetting layer of a PS-r-PMMA random copolymer can be provided by an in situ free radical polymerization of styrene and methylmethacrylate using a di-olefinic linker such as divinyl benzene, which links the copolymer to an H-terminated silicon surface to produce about a 10-nm to 15-nm thick film.

Referring again to FIGS. 3 and 4, in another embodiment, a neutral wetting random copolymer material 12' can be applied after formation of the material layer 14' and trenches 16', 16a', which reacts selectively with the trench floor 24' (composed of the substrate 10' material) and not the trench sidewalls 20' or ends 22' (composed of the material layer 14'). For example, a random copolymer (or appropriate blend of homopolymers with a block copolymer surfactant) containing epoxide groups will react selectively to terminal amine functional groups (e.g., —NH— and —NH$_2$) on silicon nitride and silicon oxynitride surfaces relative to silicon oxide or silicon. In another example in which the trench floor 24' is silicon or polysilicon and the sidewalls 20' are a material such as an oxide (e.g., SiO$_x$), the floor 24' can be treated to form H-terminated silicon and a random copolymer material (e.g., PS-r-PVP, PS-r-PMMA, etc.) can be formed by in situ polymerization only at the floor surface.

In yet another embodiment, a neutral wetting surface (e.g., for PS-b-PMMA and PS-b-PEO) can be provided by grafting a self-assembled monolayer (SAM) of a trichlorosilane-base SAM such as 3-(para-methoxyphenyl)propyltrichorosilane grafted to oxide (e.g., SiO$_2$) as described, for example, by D. H. Park, *Nanotechnology* 18 (2007), p. 355304.

A surface that is neutral wetting to PS-b-PMMA can also be prepared by spin-coating a blanket layer of a photo- or thermally crosslinkable random copolymer such as a benzocyclobutene- or azidomethylstyrene-functionalized random copolymer of styrene and methylmethacrylate (e.g., poly(styrene-r-benzocyclobutene-r-methylmethacrylate (PS-r-PMMA-r-BCB)). For example, such a random copolymer can comprise about 42 wt% PMMA, about (58-x) wt% PS and x wt% (e.g., about 2 wt% to 3 wt%) of either polybenzocyclobutene or poly(para-azidomethylstyrene)). An azidomethylstyrene-functionalized random copolymer can be UV photo-crosslinked (e.g., 1 MW/cm$^2$ to 5 MW/cm$^2$ exposure for about 15 seconds to about 30 minutes) or thermally crosslinked (e.g., at about 170° C. for about four hours) to form a crosslinked polymer mat as a neutral wetting layer. A benzocyclobutene-functionalized random copolymer can be thermally crosslinked (e.g., at about 200° C. for about four hours or at about 250° C. for about ten minutes).

In another embodiment, a neutral wetting random copolymer of polystyrene (PS), polymethacrylate (PMMA) with hydroxyl group(s) (e.g., 2-hydroxyethyl methacrylate (P(S-r-MMA-r-HEMA)) (e.g., about 58 wt% PS) can be can be selectively grafted to a substrate 10 (e.g., an oxide) as a neutral wetting layer about 5 nm to 10 nm thick by heating at about 160° C. for about 48 hours. See, for example, In et al., *Langmuir*, 2006, 22, 7855-7860.

To provide preferential wetting trench sidewalls 20, for example, in the use of a PS-b-PVP block copolymer, the material layer 14 can be composed of silicon (with native oxide), oxide (e.g., silicon oxide, SiO$_x$), silicon nitride, silicon oxycarbide, indium tin oxide (ITO), silicon oxynitride, and resist materials such as methacrylate-based resists and polydimethyl glutarimide resists, among other materials, which exhibit preferential wetting toward the preferred block (e.g., the minority block), which is the PVP block in the illustrated embodiment. Upon annealing and self-assembly of the block copolymer material 26, the preferred block (e.g., the PVP block) will form a thin interface layer along the preferential wetting sidewalls 20 and ends 22 of the trenches 16, 16a.

In other embodiments utilizing PS-b-PMMA, a preferential wetting material such as a polymethylmethacrylate (PMMA) polymer modified with an —OH containing moiety (e.g., hydroxyethylmethacrylate) can be selectively applied onto the sidewalls of the trenches in embodiments where a neutral wetting material 12, 12', is in place on the trench floor 24, 24' (as in FIGS. 2-2B and FIG. 4). For example, a neutral wetting layer can be formed on the trench floor 24, 24' (e.g., depicted in FIG. 4 as a layer) by an in situ polymerization of a random copolymer on H-terminated silicon in the presence of SiO$_x$ sidewalls, and OH-modified PMMA then grafted to the sidewalls. An OH-modified PMMA can be applied, for example, by spin coating and then heating (e.g., to about 170° C.) to allow the terminal OH groups to selectively end-graft to the sidewalls 20 and ends 22 (e.g., of oxide) of the trenches 16, 16a, 16', 16a'. Non-grafted material can be removed by rinsing with an appropriate solvent (e.g., toluene). See, for example, Mansky et al., *Science*, 1997, 275, 1458-1460, and In et al., *Langmuir*, 2006, 22, 7855-7860.

Figure 6:
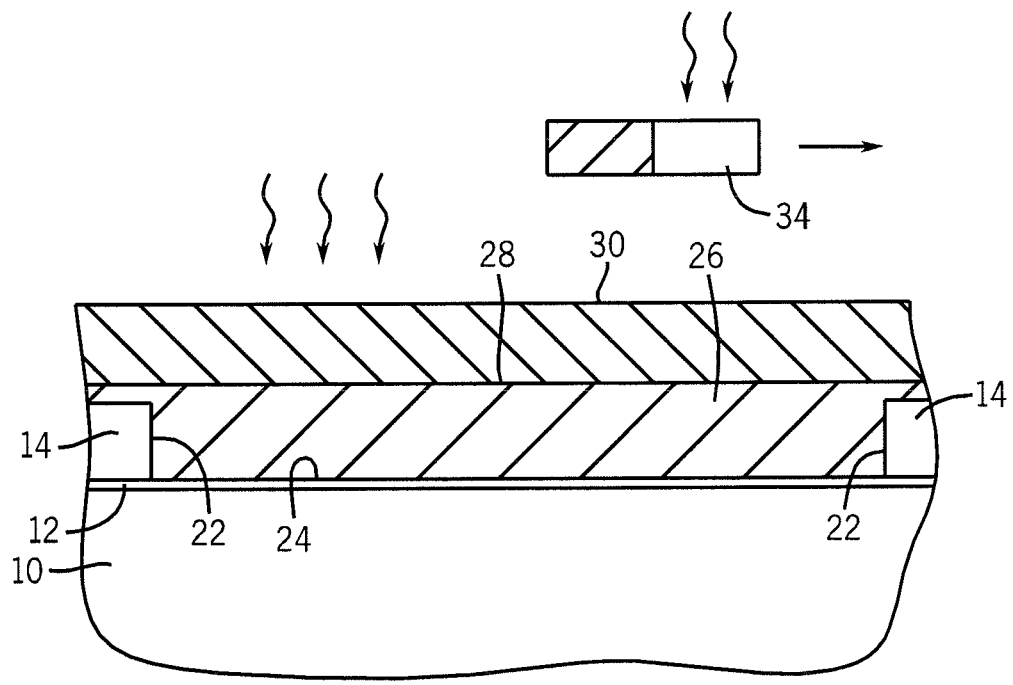
FIG. 6 is a view of the substrate depicted in FIG. 5B at a subsequent stage showing positioning of a preferential wetting material over the block copolymer material within the trenches.

Referring to FIG. 6, a surface 28 of the block copolymer material 26 in the trenches 16, 16a (see FIGS. 5A and 5B) is then contacted by a material 30 that will preferentially wet one of the blocks of the copolymer material 26, which is the minority block in the illustrated embodiment.

In an embodiment of the invention, the preferential wetting material 30 is composed of a solid material that is placed onto the surface of the block copolymer material 26. For example, the preferential wetting material 30 can be composed of a soft, flexible or rubbery solid material such as a crosslinked poly(dimethylsiloxane) (PDMS) elastomer (e.g., Sylgard 184 by Dow Corning Corp., Midland, Mich.) or other elastomeric polymer material (e.g., silicones, polyurethanes, etc.).

A crosslinked, solid PDMS material 30 provides an external surface that is hydrophobic, which can be altered, for example, by a plasma oxidation to add silanol (SiOH) groups to the surface to render the PDMS surface hydrophilic. For example, in using a PS-b-PVP (70:30) block copolymer, a PDMS material 30 having a hydrophobic surface placed into contact with the PS-b-PVP block copolymer material 26 will be preferentially wetted by the PS block, while a PDMS material 30 modified with a hydrophilic surface will be preferentially wetted by the PVP block. After annealing, a PDMS material 30 can be removed, for example, by lifting or peeling the material 30 from the surface 28 of the block copolymer material 26, which can include applying a solvent such as water, alcohols, etc. (e.g., by soaking), to permeate and swell the PDMS material 30 to enhance physical removal, and which is compatible with and does not dissolve the block copolymer. A dilute fluoride solution (e.g., NH$_4$F, HF, NaF, etc.) can also be applied to etch and dissolve away a PDMS material.

In another embodiment, the preferential wetting material 30 can be formed as an inorganic film on the surface 28 of the block copolymer material 26. For example, a layer of a spin-on dielectric (SOD) material can be formed by applying, for example, a spin-on liquid silicon-containing polymer, removing the solvent (e.g., by heating), and then oxidizing the polymer layer (e.g., oxygen atmosphere, steam-oxidation process, wet chemical oxidation, etc.) to form a hard silicon dioxide (SiO$_2$) layer, a hydrophilic surface that will be preferentially wetted by the PVP (minority) block. In embodiments of the method, the oxidation can be conducted simultaneously with a thermal anneal of the block copolymer material 26. Examples of silicon-containing polymers include silicates, siloxanes (e.g., hydrogen silsesquioxane (HSQ), hexamethyldisiloxane, octamethyltrisiloxane, etc.), silazanes (e.g., polysilazanes such as hexamethyldisilazane (HMDS), tetramethyldisilazane, octamethylcyclotetrasilazine, hexamethylcyclotrisilazine, diethylaminotrimethylsilane, dimethylaminotrimethylsilane, etc.) and silisesquioxanes (e.g., hydrogen silsesquioxane (HSQ). The spin-on polymer material can be applied, for example, by casting, spin applying, flow coating or a spray coating technique. The solvent of the spin-on polymer material is compatible with and does not dissolve the block copolymer, for example, water or an alcohol. After annealing, a layer of dielectric preferential wetting material 30 can be removed using a controlled etch back process, for example, by applying a fluoride-based etchant whereby the dielectric material is etched at a low etch rate (e.g., less than about 200 Å/minute).

Figure 7C:
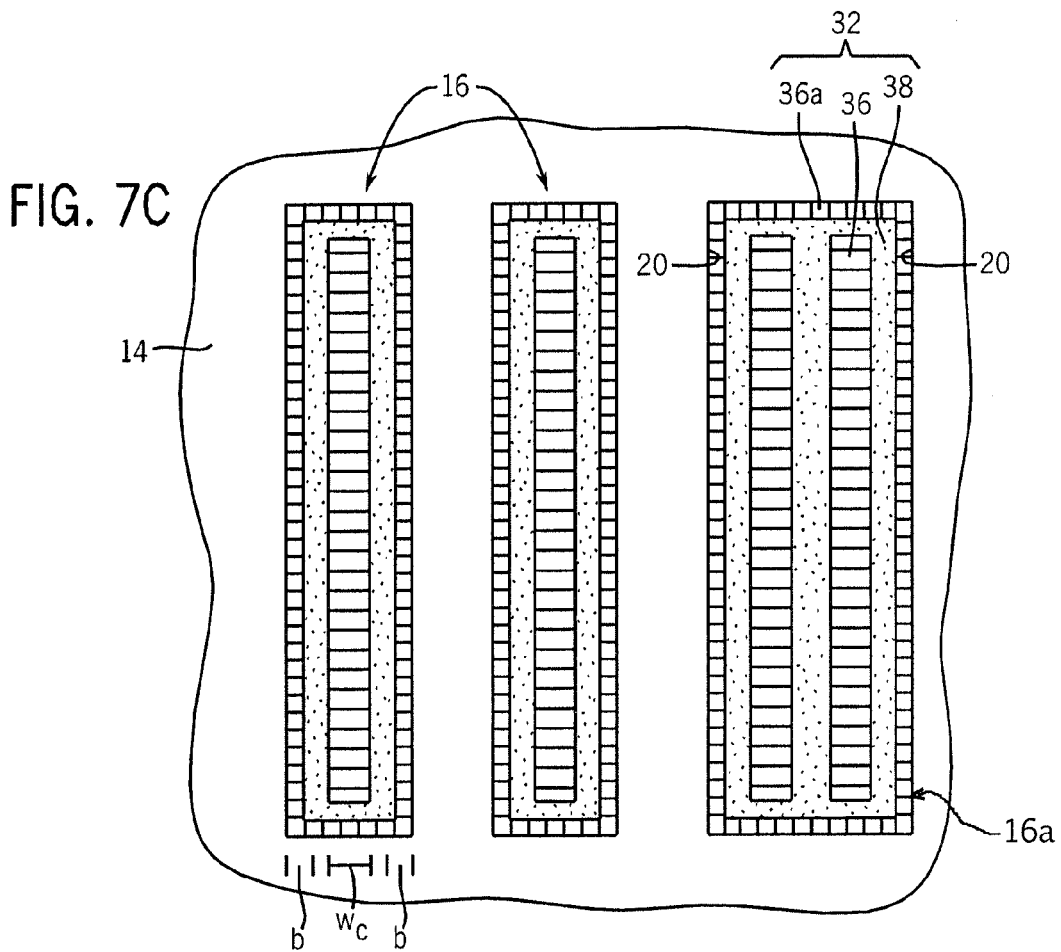
FIG. 7C is a top plan view of a cross-section of the substrate shown in FIG. 7A taken along lines 7C-7C, showing the self-assembled half-cylinder lines within a polymer matrix within the trenches.

With the preferential wetting material 30 in contact with the surface 28 of the block copolymer material 26, an annealing process is conducted (arrows ↓, FIG. 6) to cause the polymer blocks to phase separate in response to the preferential and neutral wetting of the trench surfaces and the preferential wetting of the overlying material 30, and form a self-assembled polymer material 32 as illustrated in FIGS. 7-7C.

Thermal annealing can be conducted at above the glass transition temperature of the component blocks of the copolymer material 26 (see FIG. 6). For example, a PS-b-PVP copolymer material can be globally annealed at a temperature of about 150° C. to 275° C. in a vacuum oven for about 1 hour to 24 hours to achieve the self-assembled morphology. The resulting morphology of the annealed copolymer material 32 (e.g., parallel orientation of the half-cylinder lines) can be examined, for example, using atomic force microscopy (AFM), transmission electron microscopy (TEM), scanning electron microscopy (SEM).

The block copolymer material 26 can be globally heated or, in other embodiments, a zone or localized thermal anneal can be applied to portions or sections of the block copolymer material 26. For example, the substrate 10 can be moved across a hot-to-cold temperature gradient 34 (FIG. 6) positioned above (as shown) or underneath the substrate 10 (or the thermal source can be moved relative to the substrate 10, e.g., arrow →) such that the block copolymer material 26 self-assembles upon cooling after passing through the heat source. Only those portions of the block copolymer material 26 that are heated above the glass transition temperature of the component polymer blocks will self-assemble, and areas of the material that were not sufficiently heated remain disordered and unassembled. "Pulling" the heated zone across the substrate 10 can result in faster processing and better ordered structures relative to a global thermal anneal.

Upon annealing, the cylindrical-phase block copolymer material 26 will self-assemble into a polymer material 32 (e.g., a film), as depicted in FIGS. 7-7C. In response to the character of the cylinder-phase block copolymer composition (e.g., 70:30 PS-b-PVP having an inherent pitch at or about L) combined with the boundary conditions, including the constraints provided by the width ($w_t$) of the trenches 16 and the wetting properties of the trench surfaces (i.e., a trench floor 24 that exhibits neutral or non-preferential wetting toward both polymer blocks, e.g., a random graft copolymer, and trench sidewalls 20 and an overlying material 30 that are preferential wetting to the minority block), the minority (preferred) block (e.g., PVP) will self-assemble to form parallel-oriented, downward-facing, half-cylinder domain (line) 36 on the non-preferential (neutral) wetting material 12 on the trench floor, which is parallel to the trench floor 24 and registered to the sidewalls 20 for the length ($l_t$) of trenches 16, 16a. Within the trenches, a matrix 38 of the majority polymer block (e.g., PS) overlies and surrounds the half-cylinder(s) 36. Generally, the lines of the half-cylinder 36 (both blocks considered) will have a width ($w_t$) at or about 0.5 times L.

In addition, the minority (preferred) block (e.g., PVP) will segregate to and wet the preferential wetting sidewalls 20 and ends 22 of the trenches 16, 16a to form a thin interface or wetting (brush) layer 36a, and will segregate to and wet the overlying preferential wetting material layer 30 to form an overlying thin wetting layer $36a_s$. The thickness of the wetting layers 36a, $36a_s$ (both blocks considered) is generally about 0.5 times L, which includes $\leq 0.25$ times L of the minority block and about 0.25 times L of the majority block. For example, a $\leq 0.25$ times L thick layer of the PVP block will wet oxide interfaces with attached PS domains (about 0.25 times L thick) directed outward from the oxide material.

In embodiments of the invention, the self-assembled polymer material 32 has a post-anneal thickness ($t_2$) at or below the L value, or $t_2 = b + (0.5*L)$ (where b is the thickness of the overlying wetting layer $36a_s$, both blocks considered), or $t_2 = [(\leq 0.5*L) + (0.5*L)]$, or $t_2 \leq L$.

In embodiments in which the block copolymer material 26 includes an inorganic species such as a metal (e.g., Si, Fe, etc.), the inorganic species will segregate to one polymer phase upon annealing. For example, with a PS-b-PVP copolymer combined with a silicon- and/or iron-containing additive where the pyridine group selectively solvates the Si and Fe species, during the anneal, the Si and Fe species will segregate to the PVP half-cylinders 36 (and wetting layers 36a). Suitable inorganic precursors are thermally stable and will not volatilize at the anneal temperature.

In the illustrated embodiment, the width ($w_1$) of trenches 16 are about 1.5 to 2 times L (or 1.5 to 2× the pitch value) of the block copolymer 26, resulting in the formation of a single half-cylinder down the center of the trench 16 from a block copolymer having a pitch value of about L. As depicted in FIGS. 7A and 7C, within a wider trench 16a having a width ($w_{12}$) of about (n+1)*L (or (n+1) X the pitch value), the block copolymer material will self-assemble to form multiple (n) lines of half-cylinders 36 (shown as two lines) with a center-to-center pitch distance (p) of adjacent lines at or about the pitch distance or L value of the block copolymer material. The number (n) of half-cylinder lines 36 within a trench can be varied, for example, according to the width of the trench and/or the pitch distance (p) or L value of the block copolymer material.

After the block copolymer material is annealed and ordered, the preferential wetting material 30 can be removed from contact with the assembled block copolymer material 32, as shown in FIG. 8.

For example, in the use of a solid, elastomeric material 30 such as PDMS, the material can be lifted or peeled from the surface of the block copolymer material 32. To facilitate removal, a solvent that is compatible with and does not dissolve or etch the assembled polymer domains such as water, alcohol, etc. can be applied (e.g., by spraying, soaking the material) to permeate and swell the material and enhance removal without altering or damaging the assembled polymer structure. A dilute fluoride solution (e.g., $NH_4F$, HF, NaF, etc.) can also be applied to mediate the removal and decomposition of a PDMS material.

In embodiments of the invention in which the preferential wetting material 30 is composed of an inorganic material such as a spin-on dielectric (SOD), the material 30 can be removed by a controlled etch back process, for example, by applying a fluoride-based etchant whereby the dielectric material is etched at a low etch rate (e.g., less than about 200 Å/minute) without altering or damaging the assembled polymer structure.

In embodiments in which an elastomeric material 30 is used with a block copolymer material that includes an inorganic species (e.g., Si, Fe, etc.), a process that dissolves or etches the polymer components but not the inorganic species can be used to selectively remove the organic components of the block copolymer domains, leaving the inorganic species on the substrate to form a mask material. For example, an oxygen plasma etch will remove the carbonaceous major domains, leaving inorganic material (e.g., Si, Fe, etc.) as lines on the substrate surface.

Generally, a block copolymer thin film 26a outside the trenches (e.g., on spacers 18) will not be not thick enough to result in self-assembly. Optionally, the unstructured thin film 26a can be removed, for example, by an etch technique or a planarization process to provide an about uniformly flat surface.

Optionally, the copolymer material can be treated to crosslink one of the polymer domains (e.g., the PVP half-cylinders) to fix and enhance the strength of the polymer blocks. For example, one of the polymer blocks can be structured to inherently crosslink (e.g., upon exposure to ultraviolet (UV) radiation, including deep ultraviolet (DUV) radiation), or the polymer block can be formulated to contain a crosslinking agent. For example, the trench regions can be selectively exposed through a reticle (not shown) to crosslink only the self-assembled polymer material 32 within the trenches 16, 16a and a wash can then be applied with an appropriate solvent (e.g., toluene) to remove the non-crosslinked portions of the block copolymer material 26a, leaving the registered self-assembled polymer material 32 within the trench and exposing the surface of the material layer 14 above/outside the trenches. In another embodiment, the annealed polymer material 32 can be crosslinked globally, a photoresist material can be applied to pattern and expose the areas of the polymer material 26a outside the trench regions, and the exposed portions of the polymer material 26a can be removed, for example by an oxygen ($O_2$) plasma treatment.

An embodiment of the application of the self-assembled polymer material 30 is as an etch mask to form openings in the substrate 10. After annealing and self-assembly of the polymer blocks into the half-cylinders 36 and matrix 38, and removal of the preferential wetting material 30, the assembled polymer material 32 can be processed to form a structure that can be used as an etch mask to form openings in the substrate 10.

In some embodiments of the invention, the surface wetting layer $36a_s$ (FIGS. 7A, 7C) composed of the minority block (e.g., PVP) can be selectively removed to expose the matrix 38 of the self-assembled polymer material 32. For example, a surface wetting layer $36a_s$ of PVP can be removed by an RIE process using an oxygen, fluorocarbon, or argon plasma, for example.

In embodiments of the invention in which one of the polymer domains includes an inorganic species (e.g., Si, Fe, etc.), an oxidation process such as a UV-ozonation or oxygen plasma etching, can be performed to remove the organic material (i.e., the polymer domains) and convert the inorganic species to a non-volatile inorganic oxide, e.g., silicon oxide ($SiO_x$), iron oxide ($Fe_xO_y$), etc., which remains on the substrate and can be used as a mask in a subsequent etch process.

Figure 9A:
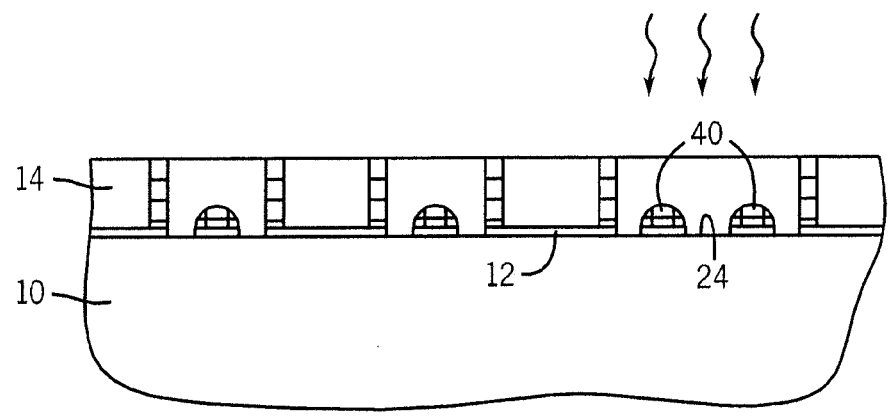
FIGS. 9A and 9B illustrate cross-sectional views of the substrate depicted in FIG. 9, taken along lines 9A-9A and 9B-9B, respectively.
Figure 9B:
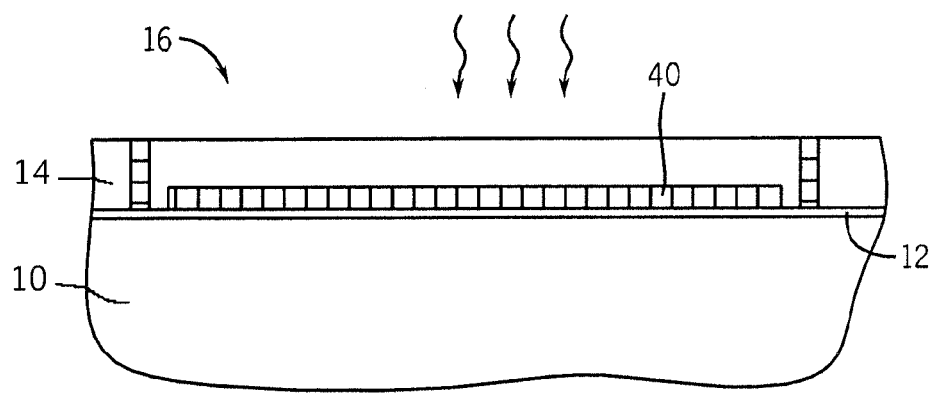

For example, as depicted in FIGS. 9-9B, in the illustrated embodiment in which the block copolymer material (26) is composed of PS-b-PVP combined (e.g., doped) with an Si- and/or Fe-containing additive, and the Si and/or Fe species are segregated to the PVP half-cylinders 36 and wetting layers 36a. An oxidation process (arrows ↓↓) can be performed to remove both the PS matrix 38 and PVP polymer component of the half-cylinders 36 (and neutral wetting layer 12) and convert the Si and/or Fe species within the half-cylinders to inorganic oxide, e.g., $SiO_x$ and/or $Fe_xO_y$ resulting in non-volatile, inorganic oxide lines 40 on the substrate 10.

In other embodiments, the matrix domain 38 of the self-assembled polymer material 32 can be selectively removed relative to the half-cylinder lines 36, which can be used as a mask to etch the exposed substrate 10 at the trench floor 24. For example, in using a PS-b-PMMA block copolymer, PMMA domains can be selectively removed by UV exposure/ acetic acid development or by selective reactive ion etching (RIE), and the remaining PS domains can then be used as a mask to etch the substrate 10.

Figure 10:
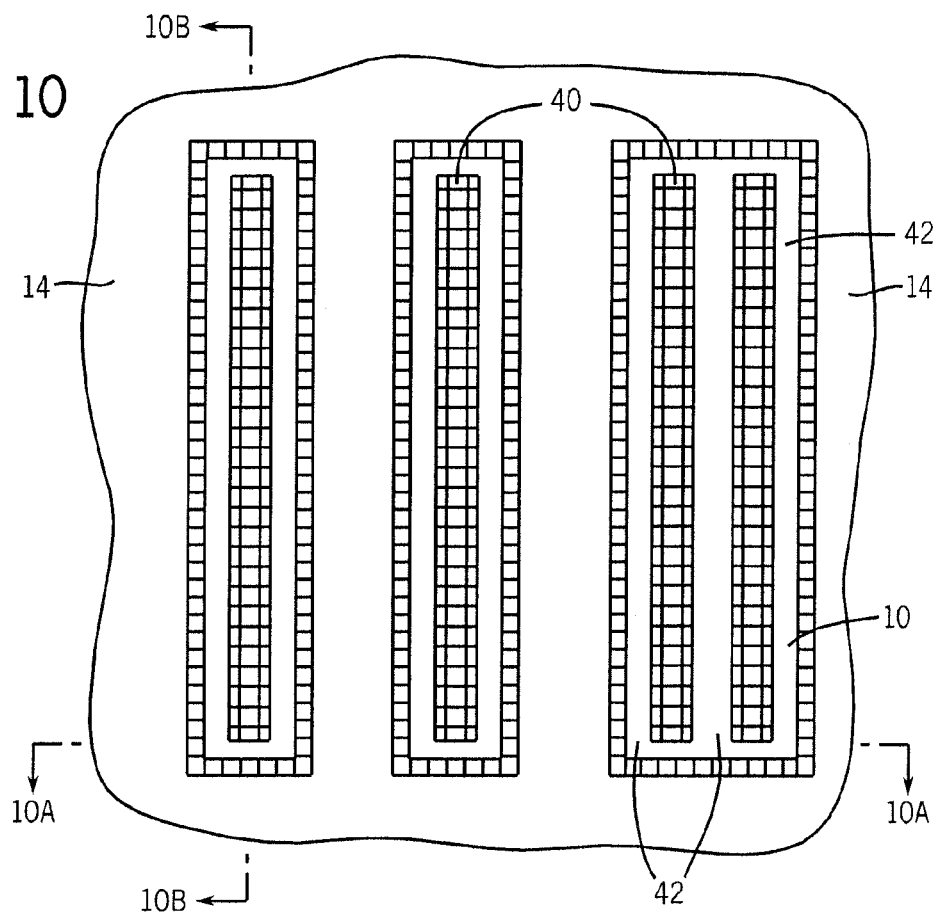
FIGS. 10 and 11 are top plan views of the substrate of FIG. 9 at subsequent stages, illustrating an embodiment of the use of the self-assembled block copolymer film after removal of one of the polymer blocks, as a mask to etch the substrate and filling of the etched openings.
Figure 10A:
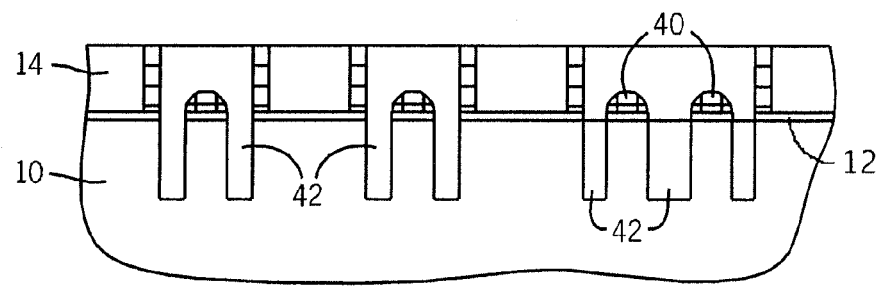
FIGS. 10A and 11A illustrate elevational, cross-sectional views of a portion of the substrate depicted in FIGS. 10 and 11 taken along lines 10A-10A and 11A-11A, respectively.
Figure 10B:
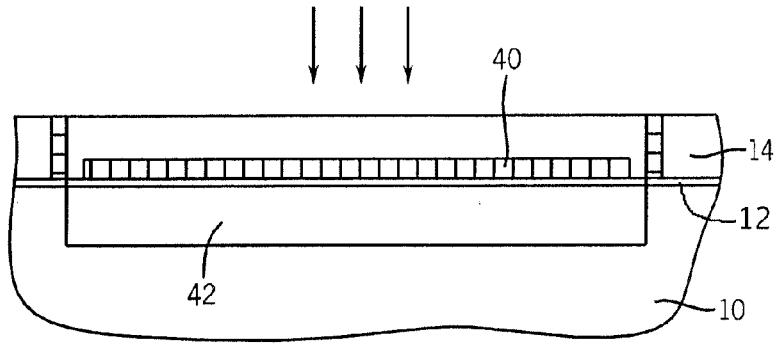
FIGS. 10B and 11B are cross-sectional views of the substrate depicted in FIGS. 10 and 11 taken along lines 10B-10B and 11B-11B, respectively.

The oxide lines 40 can then be used as a mask to etch line openings 42 (e.g., trenches) in the substrate 10, as depicted in FIGS. 10 and 10B, for example, using an anisotropic, selective reactive ion etch (RIE) process.

Figure 11:
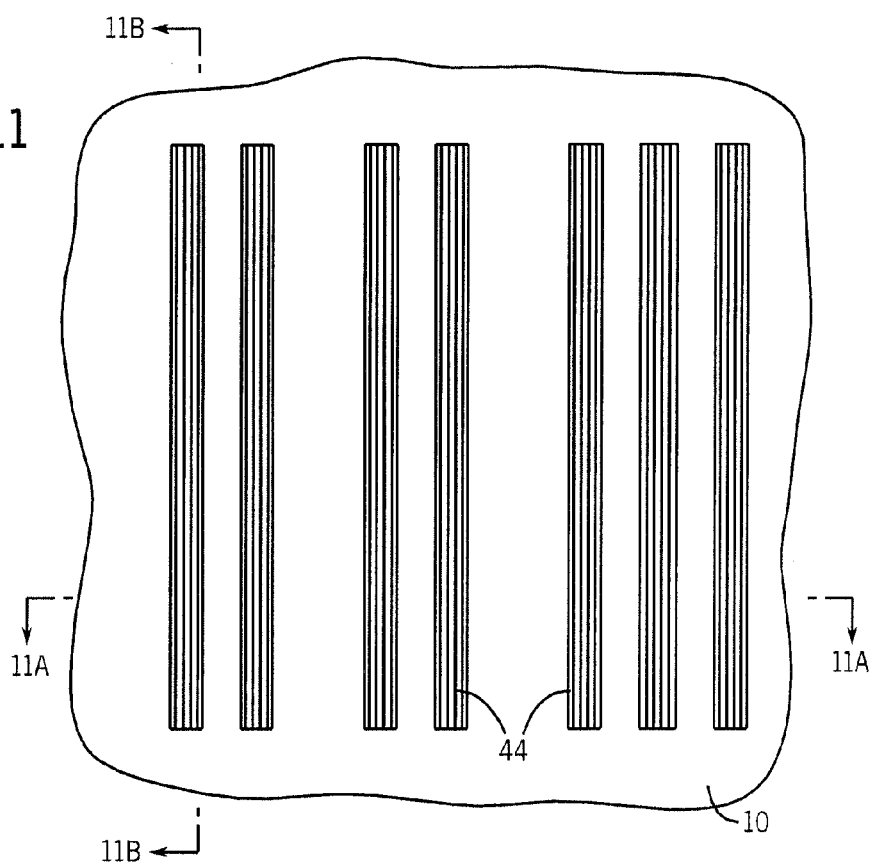
Figure 11A:
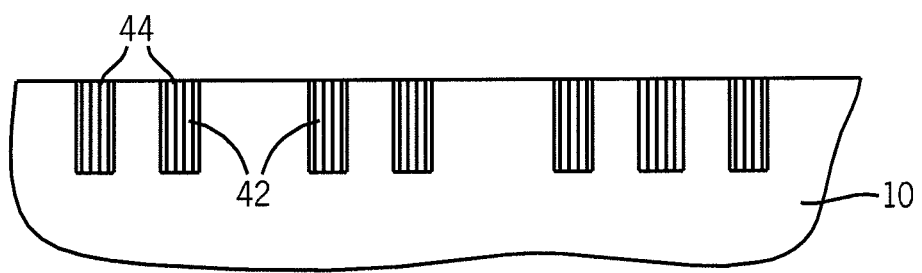
Figure 11B:
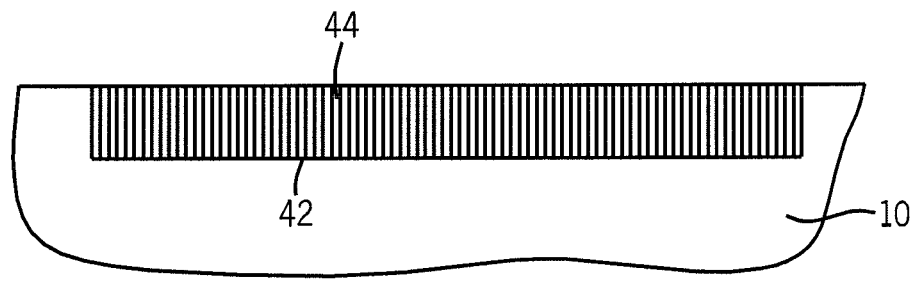

Further processing can then be performed as desired. For example, as depicted in FIGS. 11 and 11B, the residual oxide lines 40 can be removed, for example, using a fluoride-based etchant, and the substrate openings 42 can be filled with a material 44 such as a metal or metal alloy such as Cu, Al, W, Si, and $Ti_3N_4$, among others, to form arrays of conductive lines, or with an insulating material such as $SiO_2$, $Al_2O_3$, $HfO_2$, $ZrO_2$, $SrTiO_3$, and the like.

Figure 12:
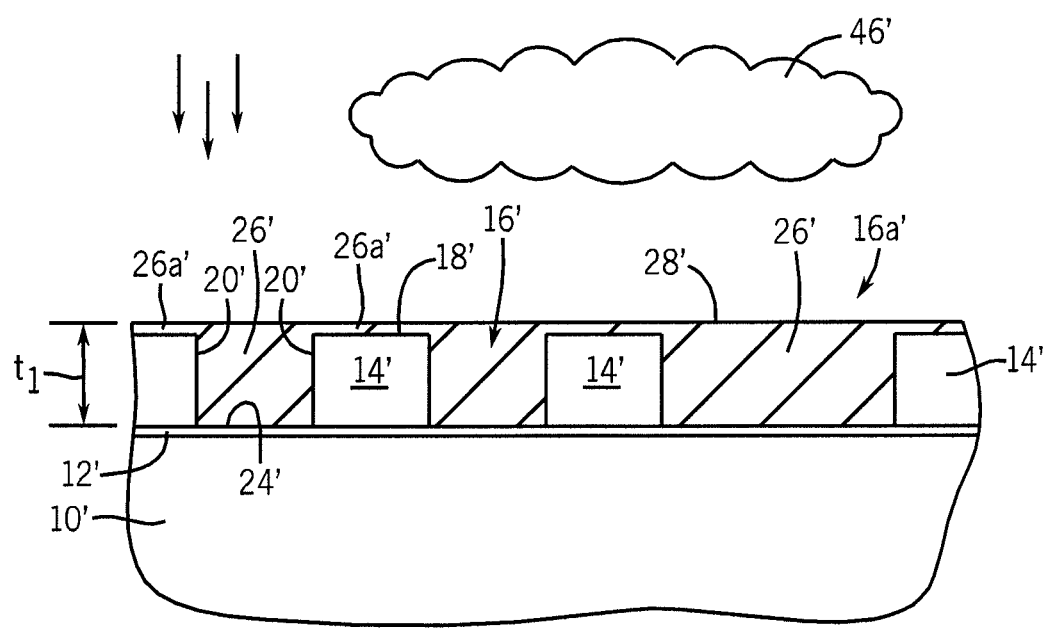
FIG. 12 is a view of the substrate depicted in FIG. 5A at a subsequent stage showing application of a preferential wetting atmosphere over the block copolymer material within the trenches according to another embodiment of the invention.

Referring now to FIG. 12, in another embodiment of the invention, an atmosphere 46' can be applied to form an air interface at the surface 28' of the block copolymer material 26' in the trenches that is preferentially wetting to one of the blocks of the copolymer material 26'.

In some embodiments, a preferentially wetting atmosphere can be composed of clean, dry air to preferentially wet the polymer block having the lower surface tension. For example, in the use of PS-b-PVP and PS-b-PEO, the PS block has a relatively lower surface tension and will preferentially wet a clean dry air atmosphere. In the use of PS-b-PDMS, the PDMS block has a lower surface tension and will preferentially wet a clean dry air atmosphere. In other embodiments, a humid atmosphere (air) can be applied to preferentially wet PEO over PS (e.g., using PS-b-PEO), or a near-saturated solvent atmosphere (e.g., ethanol, dimethylformamide (DMF), and the like) can be applied as a vapor phase to preferentially wet PVP over the PS block (e.g., using PS-b-PVP).

Figure 13:
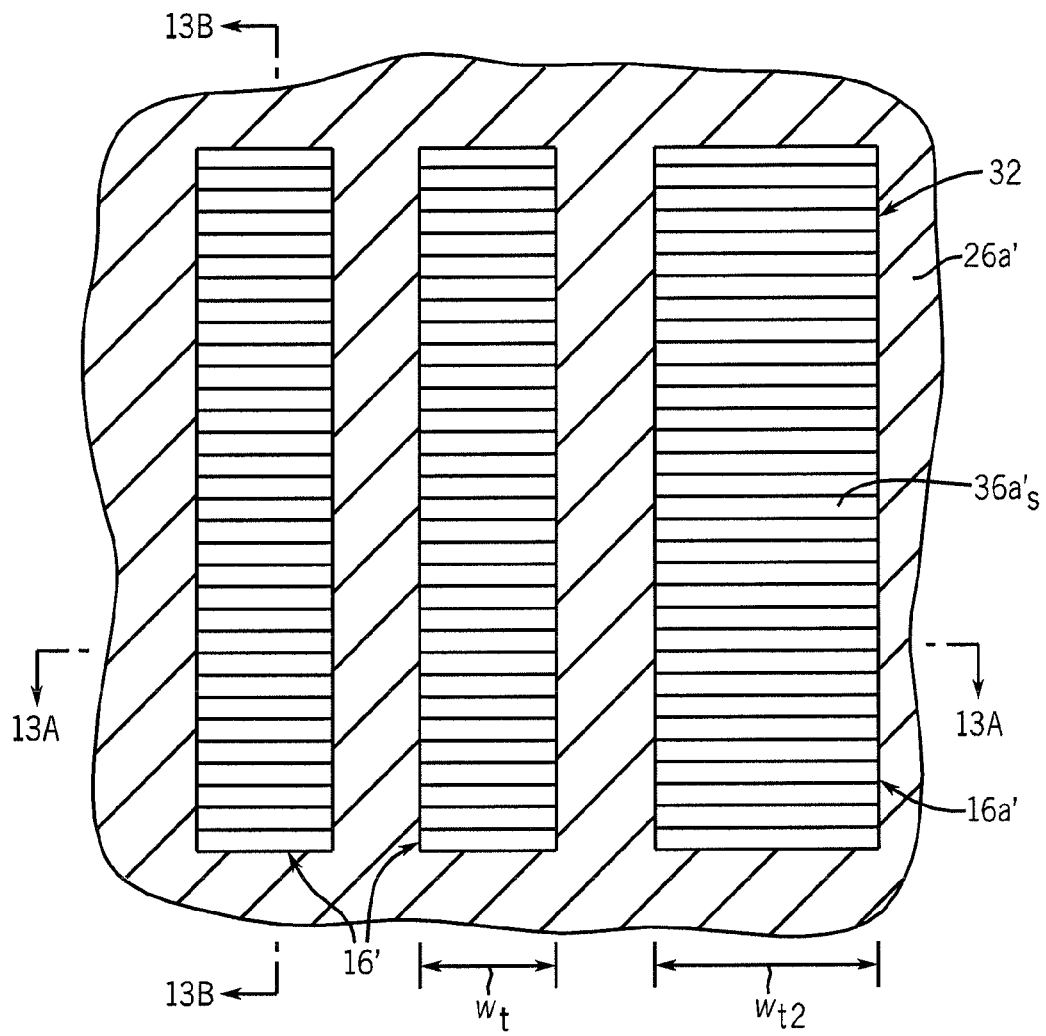
FIG. 13 is a top plan view of the substrate shown in FIG. 12 at a subsequent stage, showing a preferential wetting brush layer over the surface of the self-assembled block copolymer material within the trenches.
Figure 13A:
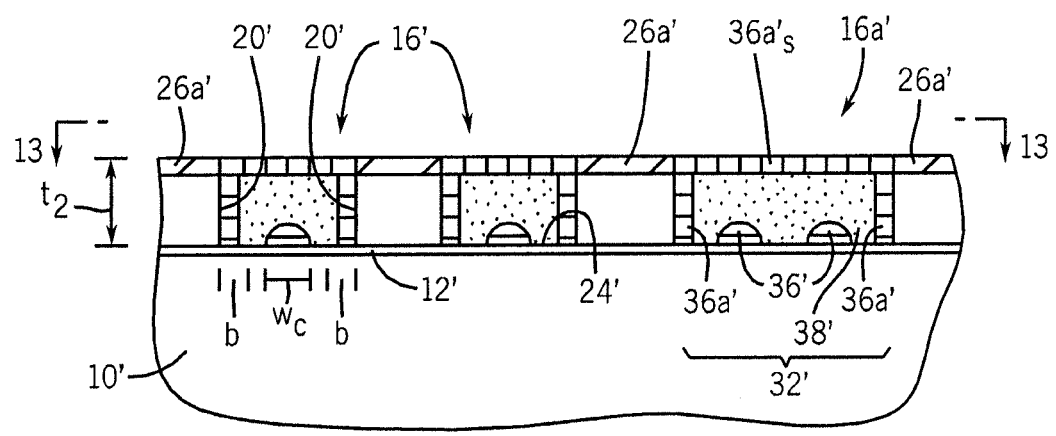
FIGS. 13A and 13B illustrate cross-sectional views of the substrate depicted in FIG. 13, taken along lines 13A-13A and 13B-13B, respectively.
Figure 13B:
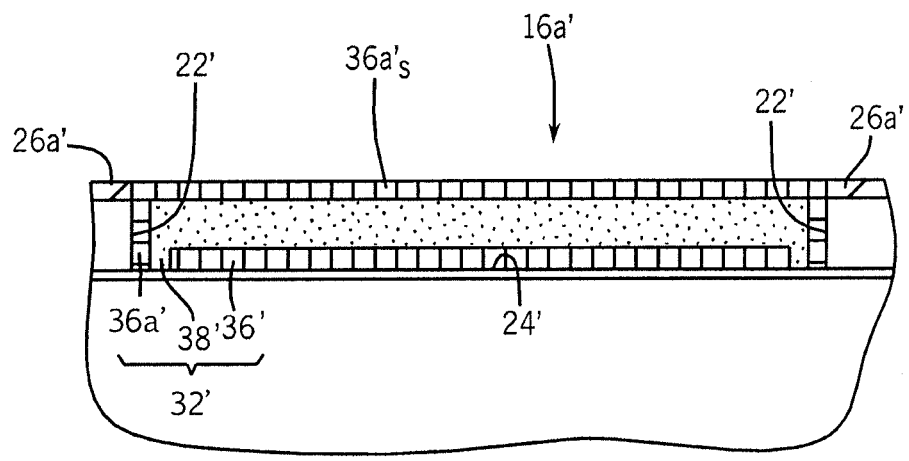

An anneal of the block copolymer material 26' in the presence of the preferentially wetting atmosphere 46' can then be conducted such that the polymer blocks phase separate in response to the preferential and neutral wetting of the trench surfaces and the preferential wetting of the overlying atmosphere 46' at the air-interface to form a self-assembled polymer material 32' as illustrated in FIGS. 13-13B. In response to the constraints provided by the width ($w_t$) of the trenches 16', 16a', a floor 24' that is neutral wetting to both polymer blocks, and sidewalls 20' and an air interface that are preferential wetting to the minority block, a cylinder-phase block copolymer composition (e.g., 70:30 PS-b-PVP (inherent pitch≈L) will self-assemble such that the minority (preferred) block (e.g., PVP) will form parallel-oriented, downward-facing, half-cylinder domains 36' on the neutral wetting material 12' on the trench floors surrounded by an overlying matrix 38' of the majority polymer block (e.g., PS). In addition, the minority (preferred) block (e.g., PVP) will segregate to and wet the sidewalls 20' and ends 22' of the trenches 16', 16a' and the air interface (e.g., using a near-saturated solvent atmosphere), which are preferential wetting to the minority block, to form an thin interface or wetting layer 36a' (on the sidewalls) and $36a_s$' (at the air interface) (e.g., at a thickness of about 0.25 times L). As another example, in the use of a cylindrical-phase PS-b-PDMS, PDMS half-cylinders 26' would assemble on the neutral wetting material 12' within an overlying PS matrix 38', and PDMS would form a brush layer 26a' on the trench sidewalls 20' and ends 22' and a brush layer $26a_s$' at the interface with a clean, dry air atmosphere that would preferentially wet PDMS.

Following the anneal, the polymer material 32' can be optionally crosslinked as previously described. In some embodiments, the surface wetting layer $36a'_s$ at the air interface (e.g., the minority block, PVP) can be selectively removed to expose the underlying matrix 38', e.g., by an RIE process. The self-assembled polymer material can then be processed as desired, for example, to form a masking material to etch the underlying substrate 10'.

Embodiments of the invention provide methods of forming structures of parallel lines that assemble via graphoepitaxy rapidly and defect-free over large areas in wide trenches. The structures formed from cylinder-forming block copolymers can be produced considerably faster than for lamellar-forming block copolymers, and have improved pattern transfer to an underlying substrate when used as an etch mask compared to arrays of minority block cylinders fully suspended in a majority block matrix due to undercutting of the matrix underneath the cylinders during etching. The methods also provide ordered and registered elements on a nanometer scale that can be prepared more inexpensively than by electron beam lithography, EUV photolithography or conventional photolithography. The feature sizes produced and accessible by this invention cannot be easily prepared by conventional photolithography. The described methods and systems can be readily employed and incorporated into existing semiconductor manufacturing process flows and provide a low cost, high-throughput technique for fabricating small structures.

Although specific embodiments have been illustrated and described herein, it will be appreciated by those of ordinary skill in the art that any arrangement calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of etching a substrate, comprising:

applying a material over and in contact with a block copolymer material within a trench in a material layer on a substrate, the material being preferentially wetting to a minority block of the block copolymer material, the trench having a length, a neutral wetting floor, and opposing sidewalls and ends that are preferentially wetting to the minority block of the block copolymer material;

annealing the block copolymer material to form one or more lines of half cylinders of the minority block within the trench within a matrix of a majority block of the block copolymer material, the one or more lines of half cylinders extending the length of the trench and oriented parallel to the neutral wetting floor, with a face oriented toward and wetting the neutral wetting floor;

removing the preferentially wetting material to expose the annealed block copolymer material within the trench;

selectively removing the majority block to expose the substrate wherein at least a portion of the one or more lines of half cylinders remains as a continuous line on the substrate; and etching exposed portions of the substrate to form a trench therein.

2. The method of claim 1, wherein the minority block of the block copolymer material comprises a metal.

3. The method of claim 2, further comprising removing the minority block and forming the metal into an inorganic metal material as a line on the substrate.

4. The method of claim 1, wherein applying the preferentially wetting material comprises contacting the block copolymer material within the trench with an elastomeric material.

5. The method of claim 1, wherein applying the preferentially wetting material comprises depositing an inorganic material to form a layer over the block copolymer material within the trench.

6. The method of claim 5, wherein the preferentially wetting material comprises an oxide material.

7. The method of claim 1, wherein the preferentially wetting material is a preferentially wetting atmosphere selected from the group consisting of dry air, humid air, and a near-saturated solvent atmosphere.

8. The method of claim 7, wherein the preferentially wetting atmosphere is a near-saturated solvent atmosphere comprising ethanol or dimethylformamide.

9. The method of claim 1, further comprising, after removing the preferentially wetting material, removing a layer of the minority block overlying a surface of the annealed block copolymer material within the trench.

10. The method of claim 1, wherein the trench has a width of about 1.5-2 times the L value of the block copolymer material, and a single line of half cylinders having a width of about 0.5 times the L value is formed within the trench.

11. The method of claim 1, wherein the trench has a width greater than about two times the L value of the block copolymer material, and two or more lines of half cylinders are formed within the trench at a center-to-center distance of about the L value of the block copolymer material.

12. The method of claim 11, wherein the trench has a width of about three or more times the L value of the block copolymer material.

13. The method of claim 1, further comprising filling the trench with a fill material.

14. The method of claim 13, wherein the fill material comprises a metal or a metal alloy.

15. The method of claim 13, wherein the fill material comprises an insulator material.

16. A method of etching a substrate, comprising:

applying an atmosphere over and in contact with a block copolymer material within a trench in a material layer on the substrate, the atmosphere being preferentially wetting to a minority block of the block copolymer material, the trench having a length, a neutral wetting floor, and opposing sidewalls and ends that are preferentially wetting to the minority block of the block copolymer material;

annealing the block copolymer material to form one or more lines of half cylinders of the minority block within the trench within a matrix of a majority block of the block copolymer material, the one or more lines of half cylinders extending the length of the trench and oriented parallel to the neutral wetting floor, with a face oriented toward and wetting the neutral wetting floor;

selectively removing the majority block to expose the substrate wherein at least a portion of the one or more lines of half cylinders remains as a continuous line on the substrate; and etching exposed portions of the substrate to form a trench therein.

17. The method of claim 16, wherein annealing the block copolymer material comprises forming a layer of the minority block over the block copolymer material.

18. The method of claim 17, further comprising removing the layer of the minority block to expose the annealed block copolymer material within the trench.

19. The method of claim 16, wherein the preferentially wetting atmosphere is selected from the group consisting of clean dry air, humid air, and a near-saturated solvent atmosphere.

* * * * *